(12) United States Patent
Katsuno et al.

(10) Patent No.: US 8,274,586 B2
(45) Date of Patent: Sep. 25, 2012

(54) SOLID-STATE IMAGING DEVICE AND METHOD OF MANUFACTURING THE SAME

(75) Inventors: Motonari Katsuno, Kyoto (JP); Kazuhiro Yamashita, Hyogo (JP); Kosaku Saeki, Niigata (JP)

(73) Assignee: Panasonic Corporation, Osaka (JP)

( * ) Notice: Subject to any disclaimer, the term of this patent is extended or adjusted under 35 U.S.C. 154(b) by 123 days.

(21) Appl. No.: 12/966,286

(22) Filed: Dec. 13, 2010

(65) Prior Publication Data

US 2011/0080509 A1    Apr. 7, 2011

Related U.S. Application Data

(63) Continuation of application No. PCT/JP2009/001731, filed on Apr. 15, 2009.

(30) Foreign Application Priority Data

Jun. 17, 2008    (JP) .................... 2008-158436

(51) Int. Cl.
*H04N 5/335* (2011.01)
*H04N 5/225* (2006.01)

(52) U.S. Cl. .............. 348/294; 348/335; 348/340

(58) Field of Classification Search ............ 348/294, 348/335, 340; 250/208.1
See application file for complete search history.

(56) References Cited

U.S. PATENT DOCUMENTS

| | | | | |
|---|---|---|---|---|
| 5,610,390 | A * | 3/1997 | Miyano | 250/216 |
| 6,008,511 | A * | 12/1999 | Tokumitsu et al. | 257/232 |
| 6,690,049 | B2 * | 2/2004 | Suzuki et al. | 257/294 |
| 7,060,961 | B2 * | 6/2006 | Dobashi et al. | 250/216 |
| 7,358,475 | B2 * | 4/2008 | Tanaka et al. | 250/208.1 |
| 7,427,742 | B2 * | 9/2008 | Drowley et al. | 250/216 |
| 7,453,130 | B2 * | 11/2008 | Nakai | 257/432 |
| 7,847,852 | B2 * | 12/2010 | Kuriyama | 348/335 |
| 8,111,982 | B2 * | 2/2012 | Iwasaki | 396/113 |
| 2001/0039061 | A1 * | 11/2001 | Suzuki et al. | 438/1 |

(Continued)

FOREIGN PATENT DOCUMENTS

JP    2004-311594    11/2004

(Continued)

OTHER PUBLICATIONS

U.S. Appl. No. 12/950,387 to Kosaku Saeki et al., which was filed on Nov. 19, 2010.

*Primary Examiner* — James Hannett
(74) *Attorney, Agent, or Firm* — McDermott Will & Emery LLP

(57) ABSTRACT

A solid-state imaging device according to an implementation of the present invention is a solid-state imaging device including a plurality of unit pixels arranged in a matrix, and each of the unit pixels includes a photodiode which performs photoelectric conversion on light so as to convert the light into an electric signal, a top lens which collects incident light, and an intralayer lens which collects, to the photodiode, the incident light collected by the top lens, and a centroid of the photodiode is displaced from a center of the unit pixel into a first direction, the top lens is formed into an asymmetric shape so as to have a centroid displaced from the center of the unit pixel into the first direction, and the intralayer lens is formed to have a centroid displaced from the center of the unit pixel into the first direction.

17 Claims, 20 Drawing Sheets

U.S. PATENT DOCUMENTS

| | | |
|---|---|---|
| 2004/0196563 A1* | 10/2004 | Natori ............................ 359/626 |
| 2005/0274968 A1 | 12/2005 | Kuo et al. |
| 2006/0023312 A1 | 2/2006 | Boettiger et al. |
| 2006/0027825 A1* | 2/2006 | Kuriyama ....................... 257/98 |
| 2006/0170810 A1 | 8/2006 | Kim |
| 2006/0273239 A1 | 12/2006 | McGrath et al. |
| 2007/0080375 A1 | 4/2007 | Kurihara et al. |
| 2007/0181923 A1 | 8/2007 | Tanaka |
| 2007/0215912 A1 | 9/2007 | Kido et al. |
| 2008/0090182 A1 | 4/2008 | Suzuki et al. |
| 2008/0296643 A1 | 12/2008 | Inoue et al. |
| 2010/0091156 A1* | 4/2010 | Kido et al. .................... 348/294 |

FOREIGN PATENT DOCUMENTS

| | | |
|---|---|---|
| JP | 2005-150492 | 6/2005 |
| JP | 2006-49721 | 2/2006 |
| JP | 2006-114592 | 4/2006 |
| JP | 2006-215547 | 8/2006 |
| JP | 2006-303468 | 11/2006 |
| JP | 2007-95751 | 4/2007 |
| JP | 2007-208817 | 8/2007 |
| JP | 2008-32912 | 2/2008 |
| JP | 2008-153370 | 7/2008 |
| JP | 2008-300631 | 12/2008 |
| WO | 2006/130517 | 12/2006 |
| WO | 2007/027518 | 3/2007 |

* cited by examiner

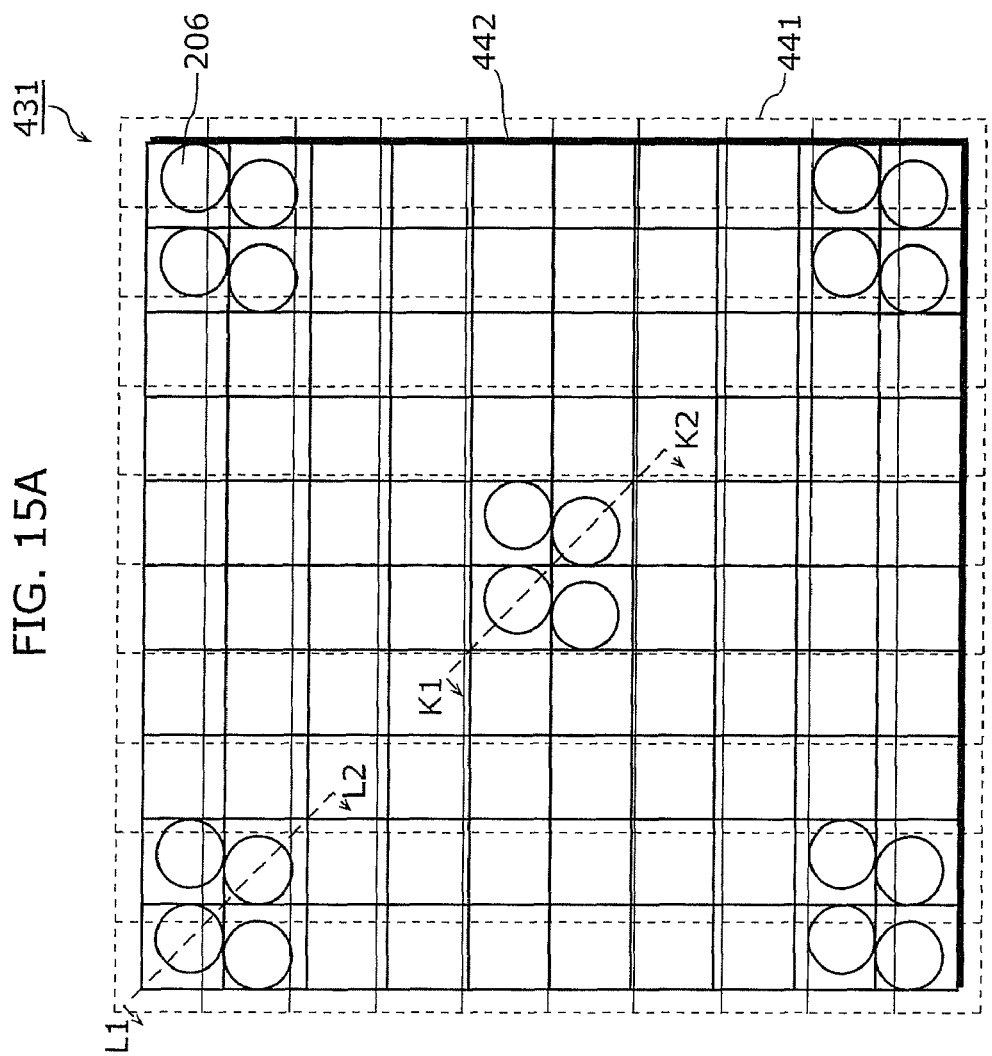

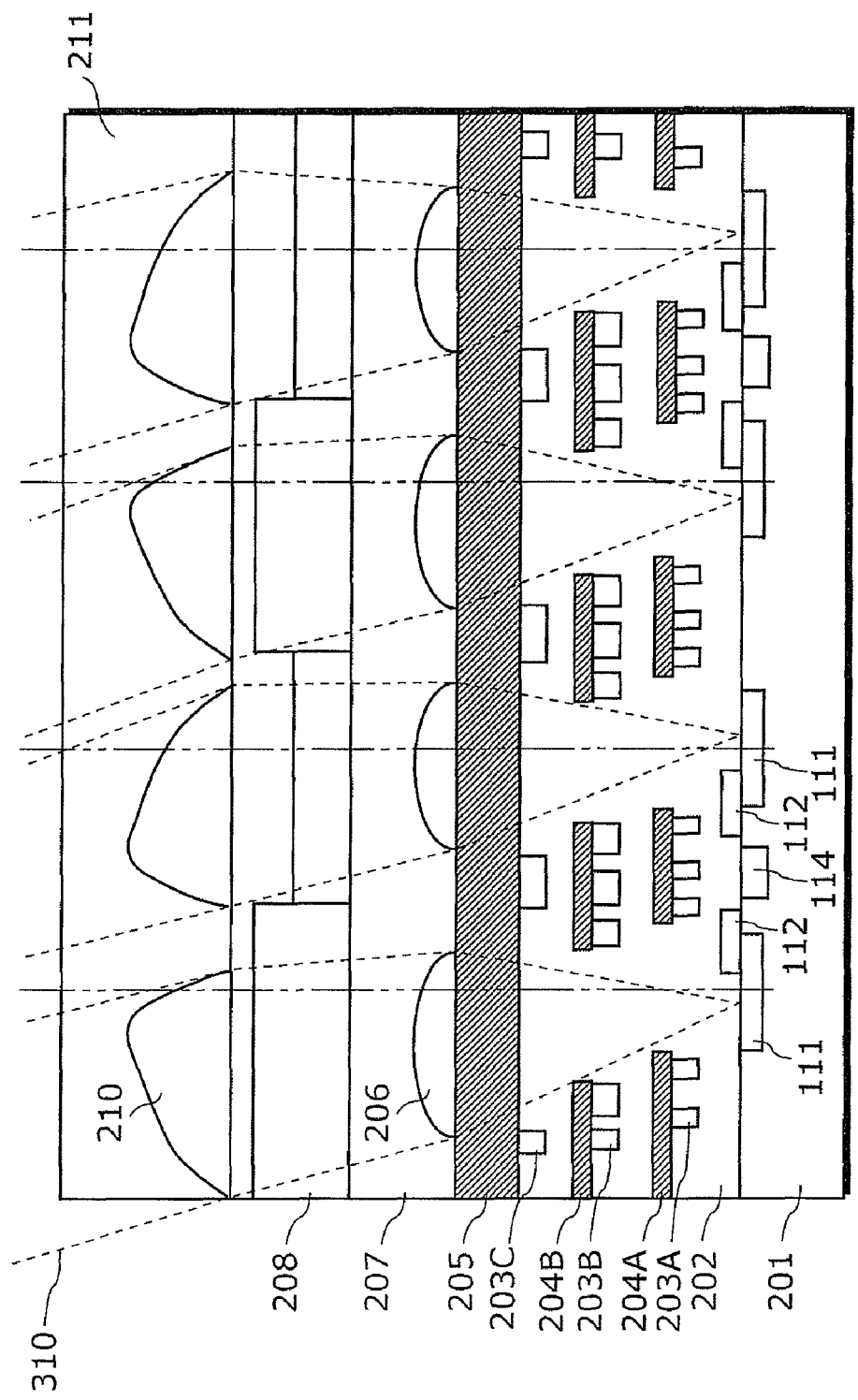

US 8,274,586 B2

SOLID-STATE IMAGING DEVICE AND METHOD OF MANUFACTURING THE SAME

CROSS REFERENCE TO RELATED APPLICATION

This is a continuation application of PCT application No. PCT/JP2009/001731 filed on Apr. 15, 2009, designating the United States of America.

BACKGROUND OF THE INVENTION (1) Field of the Invention

The present invention relates to solid-state imaging devices and manufacturing methods thereof, and relates particularly to a solid-state imaging device including plural pixels arranged in a matrix.

(2) Description of the Related Art

A generally known solid-state imaging device includes: a complementary metal oxide semiconductor (CMOS) image sensor and a charge coupled device (CCD) image sensor. Compared to the manufacturing process for the CCD image sensor, the process of manufacturing the CMOS image sensor has an advantage of allowing mounting of plural circuits on a chip because the process of manufacturing the CMOS image sensor is similar to the process of manufacturing an LSI in the CMOS. For example, the CMOS image sensor allows mounting an A/D conversion circuit, a timing generator and the like on the same chip.

On the other hand, in the CMOS image sensor, it is difficult, in some cases, to secure excellent sensitivity characteristics due to decrease in an amount of light incident on a photodiode.

This is because the CMOS image censor requires a plurality of wiring layers (normally, 2 to 4 layers) to be formed so as to carry a plurality of circuits. The metal wiring, blocking the incident light, makes it more difficult for the incident light to reach the photodiode.

Thus, a configuration is suggested which allows efficient collection of incident light using two lenses formed on the photodiode (For example, see: Japanese Unexamined Patent Application Publication No. 2006-114592).

The following will describe a conventional solid-state imaging device.

FIG. 17 is a diagram showing a circuit configuration of a unit cell of a conventional solid-state imaging device.

A solid-state imaging device 500 shown in FIG. 17 includes: a unit pixel 510, a horizontal selection transistor 123, a vertical scanning circuit 140, and a horizontal scanning circuit 141. Note that FIG. 17 shows only one unit pixel 510, but the solid-state imaging device 500 includes a plurality of unit pixels 510 arranged in a matrix.

The unit pixel 510 includes: a photodiode 111, a charge transfer gate 112, a floating diffusion (FD) unit 114, a reset transistor 120, a vertical selection transistor 121, and an amplifying transistor 122.

The photodiode 111 is a photoelectric conversion unit which converts incident light into a signal charges (electrons) and accumulates signal charges resulted from such conversion.

A gate electrode of the charge transfer gate 112 is connected to a read signal line 113. The charge transfer gate 112 transfers the signal charges accumulated in the photodiode 111 to the FD unit 114, based on a read pulse applied to the read signal line 113.

The FD unit 114 is connected to a gate electrode of the amplifying transistor 122.

The amplifying transistor 122 performs impedance conversion to convert the potential variation at the FD unit 114 into a voltage signal, and applies the voltage signal resulted from the conversion to the vertical signal line 133.

A gate electrode of the vertical selection transistor 121 is connected to the vertical selection line 131. The vertical selection transistor 121 turns ON or OFF based on a vertical selection pulse applied to the vertical selection line 131, and drives the amplifying transistor 122 for a predetermined period of time.

A gate electrode of the reset transistor 120 is connected to the vertical reset line 130. The reset transistor 120 resets the potential of the FD unit 114 to the potential of the power line 132, based on a vertical reset pulse applied to the vertical reset line 130.

The vertical scanning circuit 140 and the horizontal scanning circuit 141 scan the plurality of unit pixels 510 once per cycle.

Specifically, the vertical scanning circuit 140 selects, by applying the vertical selection pulse to the vertical selection line 131 for a predetermined period of time in one cycle, a row of unit pixels 510 corresponding to the vertical selection line 131. An output signal (voltage signal) for each of the selected unit pixels 510 is transmitted to the vertical signal line 133.

The horizontal scanning circuit 141 selects a horizontal selection transistor 123 by sequentially applying a horizontal selection pulse to each horizontal selection line 134 for a given period of time.

The selected horizontal selection transistor 123 transmits, to the horizontal signal line 135, an output signal of the vertical signal line 133 connected to the horizontal selection transistor 123.

After the horizontal scanning circuit 141 finishes scanning every unit pixel 510 included in one row, the vertical scanning circuit 140 applies the vertical selection pulse to the vertical selection line 131 in the next row. Next, in the same manner as above, each pixel in another row is scanned.

By repeating this operation to scan every unit pixel 501 once per cycle, the output signals from all the unit pixels 510 are transmitted to the horizontal signal line 135 in a temporal sequence.

FIG. 18 is a cross-sectional view showing a configuration of an imaging area captured by the conventional solid-state imaging device 500.

FIG. 19 is a diagram schematically showing a connection relationship between constituent elements of the unit pixels 510.

As shown in FIG. 18, the solid-state imaging device 500 includes: a semiconductor substrate 201, an insulation layer 202, wirings 203A to 203C, a light-shielding film 204A and 204B, a passivation film 205, an intralayer lens 606, a planarizing film 207, a color filter 208, and a top lens 610.

The photodiode 111 and the FD unit 114 are formed in the semiconductor substrate 201, and the charge transfer gate 112 is formed on the semiconductor substrate 201.

The insulation layer 202 is formed on the semiconductor substrate 201. The wirings 203A to 203C in plural layers are formed inside the insulation layer 202. The wirings 203A to 203C are made of, for example, aluminum.

The light-shielding films 204A and 204B, formed on the wiring 203A and wiring 203B, respectively, prevent incidence of light onto a circuit portion including the transistor. The light-shielding films 204A and 204B are protection films for the wiring formed at the time of manufacturing the wiring.

Normally, in the case where the wirings 203A to 203C are made of a corrosion-prone material such as Cu, a protection film such as a SiN film or a SiON film is formed, at the time of the manufacturing, for the purpose of protecting the wirings 203A to 203C. In this case, the protection film is formed across an entire top surface of the wirings 203A to 203C. However, when the protection film is formed on the photodiode 111, a film stack of a silicon oxide film and a silicon nitride film (protection film) are formed on the photodiode 111. This reflects a light ray incident on the photodiode 111.

Thus, it is preferable that the protection film (silicon nitride film) be removed only from the top of the photodiode 111. In addition, in a region except for the top of the photodiode 111, it is preferable to leave the protection film because the protection film functions as a light-shielding film.

In addition, a photoelectric conversion is caused when incident light 310 leaks into the circuit portion. Electrons generated as a result cause aliasing, which is a noise. By providing light-shielding films 204A and 204B, it is possible to reduce the noise.

The passivation film 205, which is formed on the insulation layer 202, is made of, for example, silicon nitride.

The intralayer lens 606 is formed on the passivation film 205.

The planarizing film 207 is formed on the intralayer lens 606, and is made of, for example, silicon oxide or resin (acrylic resin or fluorinated resin).

The color filter 208 is formed on the planarizing film 207.

The top lens 610 is an on-chip lens formed on the color filer 208.

As shown in FIG. 19, n-type impurity layers included each of the photodiode 111, the FD unit 114, and the reset transistor 120 are provided to be connected by a channel region under the gate electrodes. With this, it is possible to efficiently transfer and erase signal charges.

In addition, the top lens 610 and the intralayer lens 606 collect the incident light 310 to the photodiode 111. The top lens 610 and the intralayer lens 606 are formed at equal intervals at a regular pitch.

Here, in the conventional solid-state imaging device 500, a relative positional relationship in one unit pixel 510, between each of the photodiode 111, the charge transfer gate 112, the FD unit 114, the reset transistor 120, the vertical selection transistor 121, the amplifying transistor 122, the intra-pixel wiring, the top lens 610, and the intralayer lens 606, is common to the plurality of unit pixels 510. That is, the respective constituent elements are placed at equal intervals at the same pitch so as to have the same translational symmetry. This as a result causes the incident light 310 to fall on the photodiode 111 of each unit pixel in the same manner, thus allowing obtaining a satisfactory image which has less unevenness between each unit pixel 510.

On the other hand, as described above, an amplification-type solid-state imaging device such as the CMOS image sensor requires at least two layers, and preferably at least three layers of multilayer wiring, and this results in a thicker configuration to be formed above the photodiode 111. For example, a height from the top surface of the photodiode 111 to the wiring 203C in a top third layer is 3 to 5 μm, which is almost equivalent to a pixel size.

This presents a problem of larger shading in an area closer to a periphery of an imaging area, in a solid-state imaging device which first forms an image through a lens and then captures the image. That is, the light-shielding films 204A and 204B and the wirings 203A to 203C block the light that is obliquely incident, and thereby the amount of light collected to the photodiode 111 is decreased. This causes a problem of significant degradation of image quality.

Thus, a method referred to as pupil correction is used, which is a method of reducing the shading in the area closer to the periphery of the imaging area by correcting positions of openings of the top lens 610 and the light-shielding films 204A and 204B so as to collect the obliquely incident light as well to the photodiode 111. Specifically, the openings of the top lens 610, and the light-shielding films 204A and 204B are provided out of alignment in a direction from which the light enters as viewed from the photodiode 111.

In addition, another method used for preventing decrease in the amount of light incident on the photodiode 111 is to suppress a decrease in the area of the photodiode 111 that is caused by reducing area of the transistor in the unit pixels 510. However, this technique has a limit in maintaining characteristics of the solid-state imaging device.

Suggested in response is a solid-state imaging device having a multi-pixel one-cell configuration in which adjacent unit pixels 510 share the FD unit 114, the amplifying transistor 122, the vertical selection transistor 121, and the reset transistor 120 which have conventionally been provided in each unit pixel 510, except the photodiode 111 and the charge transfer gate 112 that are essential for each unit pixel 510. For the solid-state imaging device having the multi-pixel one-cell configuration, it is possible to reduce the number of transistors and the number of lines per unit pixel. With this, it is possible to secure sufficient area for the photodiode 111 and reduce vignetting due to the wiring, thus allowing an effective response to downsizing of unit pixels.

SUMMARY OF THE INVENTION

However, in the multi-pixel one-cell configuration, the photodiode 111 is not placed at a regular pitch. Alternatively, a virtual centroid of the photodiode 111 is not positioned at a regular pitch due to the gate electrode provided on the photodiode 111. With this, the center of the light incident on the photodiode 111 does not coincide with the center of the photodiode 111. Accordingly, sensitivity is reduced by a decrease in an amount of incident light. In addition, the amount of light incident on the photodiode 111 is caused to be uneven between unit pixels 510, depending on the angle of the incident light. This causes unevenness in signal output from each unit pixel 510. That is, this causes a problem of unevenness of sensitivity between pixels.

Thus, an object of the present invention is to provide a solid-state imaging device which can suppress unevenness of sensitivity between pixels and a manufacturing method of such a solid-state imaging device.

To achieve the above object, a solid-state imaging device according to an aspect of the present invention is a solid-state imaging device including a plurality of pixels arranged in a matrix, and each of the plurality of pixels includes: a photoelectric conversion unit which performs photoelectric conversion on light so as to convert the light into an electric signal; a first lens which collects incident light; and a second lens which collects, to the photoelectric conversion unit, the incident light collected by the first lens, an effective center of a light-receiving face of the photoelectric conversion unit is displaced from a pixel center into a first direction, the first lens is formed into an asymmetric shape to have a focal position displaced from the pixel center into the first direction, and the second lens is formed to have a focal position displaced from the pixel center into the first direction.

According to this configuration, the focal positions of the first and second lenses are displaced from the center of the pixel toward the effective center of the light-receiving face of the photoelectric conversion element. With this, the solid-state imaging device according to the aspect of the present invention can increase the amount of light incident on the photoelectric conversion unit.

Furthermore, even in the case where the photoelectric conversion unit is not placed at a regular pitch, that is, even when the relative position of the photoelectric conversion element is different between each pixel, it is possible to reduce unevenness, between the pixels, of the amount of light incident on the photoelectric conversion unit, by approximating, in each pixel, the focal positions of the first and second lenses to the effective center of the light-receiving face of the photoelectric conversion unit. That is, the solid-state imaging device according to the aspect of the present invention can suppress unevenness of sensitivity between the pixels.

Furthermore, by using the first lens that is asymmetric, the solid-state imaging device according to the aspect of the present invention can suppress decrease in the area of the first lens as a result of displacing the focus.

In addition, each of the plurality of pixels may further include a gate electrode which covers part of the light-receiving face of the photoelectric conversion unit and through which to transfer the electric signal resulting from the photoelectric conversion performed by the photoelectric conversion unit, and the first direction may be opposite to a direction in which the gate electrode is placed, with respect to the photoelectric conversion unit.

With this configuration, even in the case where an effective center of the light-receiving face of the photoelectric conversion unit differs between pixels due to difference in placement position of the gate electrode between pixels, it is possible to reduce unevenness of the amount of light incident on the photoelectric conversion unit between pixels.

In addition, the first lens may be: symmetric with respect to a face which is perpendicular to a surface of the photoelectric conversion unit and is laterally located along the first direction, and which includes the pixel center; and asymmetric with respect to a face which is perpendicular to the surface of the photoelectric conversion unit and is also perpendicular to the first direction, and which includes the pixel center.

In addition, in each of the plurality of pixels, a region which is located at an end opposite to the first direction and in which the first lens is not formed may be wider than a region which is located at an end in the first direction and in which the first lens is not formed.

With this configuration, the solid-state imaging device according to the aspect of the present invention allows displacing the focal position of the first lens as well as suppressing the decrease in the area of the first lens as a result of displacing the focus.

In addition, the first direction may be a diagonal direction of each of the plurality of pixels.

In addition, of first lenses included in four adjacent pixels, the first lens may contact first lenses included in two pixels located in the first direction and need not contact first lenses included in two pixels located in a direction opposite to the first direction.

With this configuration, the solid-state imaging device according to the aspect of the present invention can improve a light collection ratio of the first lens.

In addition, in each of the plurality of pixels, the second lens may have almost a same shape and may be placed to have a center displaced from the pixel center into the first direction.

With this configuration, it is possible to displace the focal position of the first lens, using the second lens having the same shape as the conventional lens.

In addition, each of the first and second lenses may be formed to have the focal position displaced from the pixel center into the first direction at a distance equivalent to half a distance in a gate length direction of the gate electrode included in a region in which the gate electrode covers part of the photoelectric conversion unit.

With this configuration, it is possible to approximately match the focal positions of the first and second lenses with the effective center of the light-receiving face of the photoelectric conversion unit.

In addition, the first lens may be placed to have a center displaced from the pixel center into the first direction.

In addition, each of the plurality of pixels may include a first pixel and a second pixel, and the first direction may be different between the first and second pixels.

In addition, the plurality of pixels may have a multi-pixel one-cell configuration in which one cell includes multiple pixels, and the one cell may include the first and second pixels.

In addition, in each of the plurality of pixels, the photoelectric conversion unit may be placed based on a first placement cell, and the first and second lenses may be placed based on a second placement cell, in a pixel array including the plurality of pixels arranged in a matrix, a center of the second placement cell may be displaced, as viewed along a direction from a center of the pixel array toward a periphery, further toward the center of the pixel array with respect to a center of the first placement cell, the first placement cell and the second placement cell being included in each of the plurality of pixels, the effective center of the light receiving face of the photoelectric conversion unit may be displaced from the center of the first placement cell into the first direction, the first lens may be formed to have the focal position displaced from the center of the second placement cell into the first direction, and the second lens may be formed to have the focal position displaced from the center of the second placement cell into the first direction.

With this configuration, it is possible to suppress decrease in the amount of light incident on the photoelectric conversion unit, in pixels in the periphery of the pixel array.

In addition, the second lens may be an upwardly convex lens.

In addition, the second lens may be a downwardly convex lens.

With this configuration, it is possible to achieve a smaller distance between the surface of the photoelectric conversion unit and the first lens, and a smaller distance between the surface of the photoelectric conversion unit and the second lens than in the case of using the upwardly convex lens. With this, it is easier to collect incident light to the photoelectric conversion unit.

In addition, a method of manufacturing a solid-state imaging device according to an aspect of the present invention is a method of manufacturing a solid-state imaging device including a plurality of pixels arranged in a matrix, and each of the plurality of pixels includes: a photoelectric conversion unit which performs photoelectric conversion on light so as to convert the light into an electric signal; a first lens which collects incident light; and a second lens which collects, to the photoelectric conversion unit, the incident light collected by the first lens, and the method includes: forming the photoelectric conversion unit of which a light-receiving face has an effective center displaced from a pixel center into a first direction; forming the second lens having a focal position displaced from the pixel center into the first direction; and forming the first lens into an asymmetric shape to displace the focal position from the pixel center into the first direction.

According to this configuration, the focal positions of the first and second lenses are displaced from the center of the pixel toward the effective center of the light-receiving face of the photoelectric conversion element. With this, the solid-state imaging device according to the aspect of the present invention can increase the amount of light incident on the photoelectric conversion unit.

Furthermore, even in the case where the photoelectric conversion unit is not placed at a regular pitch, that is, even when the relative position of the photoelectric conversion element is different between each pixel, it is possible to suppress unevenness, between the pixels, in the amount of light incident on the photoelectric conversion unit by approximating, in each pixel, the focal positions of the first and second lenses to the effective center of the light-receiving face of the photoelectric conversion unit. That is, the solid-state imaging device manufactured by the method according to the aspect of the present invention can suppress unevenness of sensitivity between pixels.

Furthermore, the solid-state imaging device manufactured by the method according to the aspect of the present invention can suppress, using such an asymmetric first lens, the decrease in the area of the first lens as a result of displacing the focal point.

In addition, the forming of the first lens may include: patterning a material for the first lens, using a mask which is: symmetric with respect to a center line extended in the first direction including the pixel center; and asymmetric with respect to a center line that is orthogonal to the first direction including the pixel center; and reflowing the patterned material, so as to form the first lens so having an asymmetric shape and a curved convex surface.

In addition, in the patterning, the material for the first lens may be patterned, using the mask, into a pentagonal shape that is formed by cutting off one of angles of a rectangle, and the one of the angles of the rectangle may be located opposite to the first direction.

This facilitates manufacturing of the first lens that is asymmetric.

As described above, according to an implementation of the present invention, it is possible to provide a solid-state imaging device which can suppress unevenness of sensitivity between pixels and a manufacturing method of the solid-state imaging device.

Further Information about Technical Background to this Application

The disclosure of Japanese Patent Application No. 2008-158436 filed on Jun. 17, 2008 including specification, drawings and claims is incorporated herein by reference in its entirety.

The disclosure of PCT application No. PCT/W2009/001731 filed on Apr. 15, 2009, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 15A is a plan view showing a placement of an intralayer lens in a pixel array according to the second embodiment of the present invention;

FIG. 16 is a cross-sectional view of the pixel array in a periphery in the solid-state imaging device according to the second embodiment of the present invention;

DESCRIPTION OF THE PREFERRED EMBODIMENTS

Hereinafter, a solid-state imaging device according to embodiments of the present invention will be described with reference to the drawings.

First Embodiment

In each unit pixel in a solid-state imaging device according to a first embodiment of the present invention, focal positions of a top lens and an intralayer lens are almost coincident with an effective center of a light-receiving face of a photodiode. This allows the solid-state imaging device according to the first embodiment of the present invention to suppress unevenness of sensitivity between pixels.

The solid-state imaging device according to the first embodiment of the present invention is a MOS image sensor (CMOS image sensor). In addition, a solid-state imaging device 100 according to the first embodiment of the present invention has a four-pixel one-cell configuration.

Figure 1:
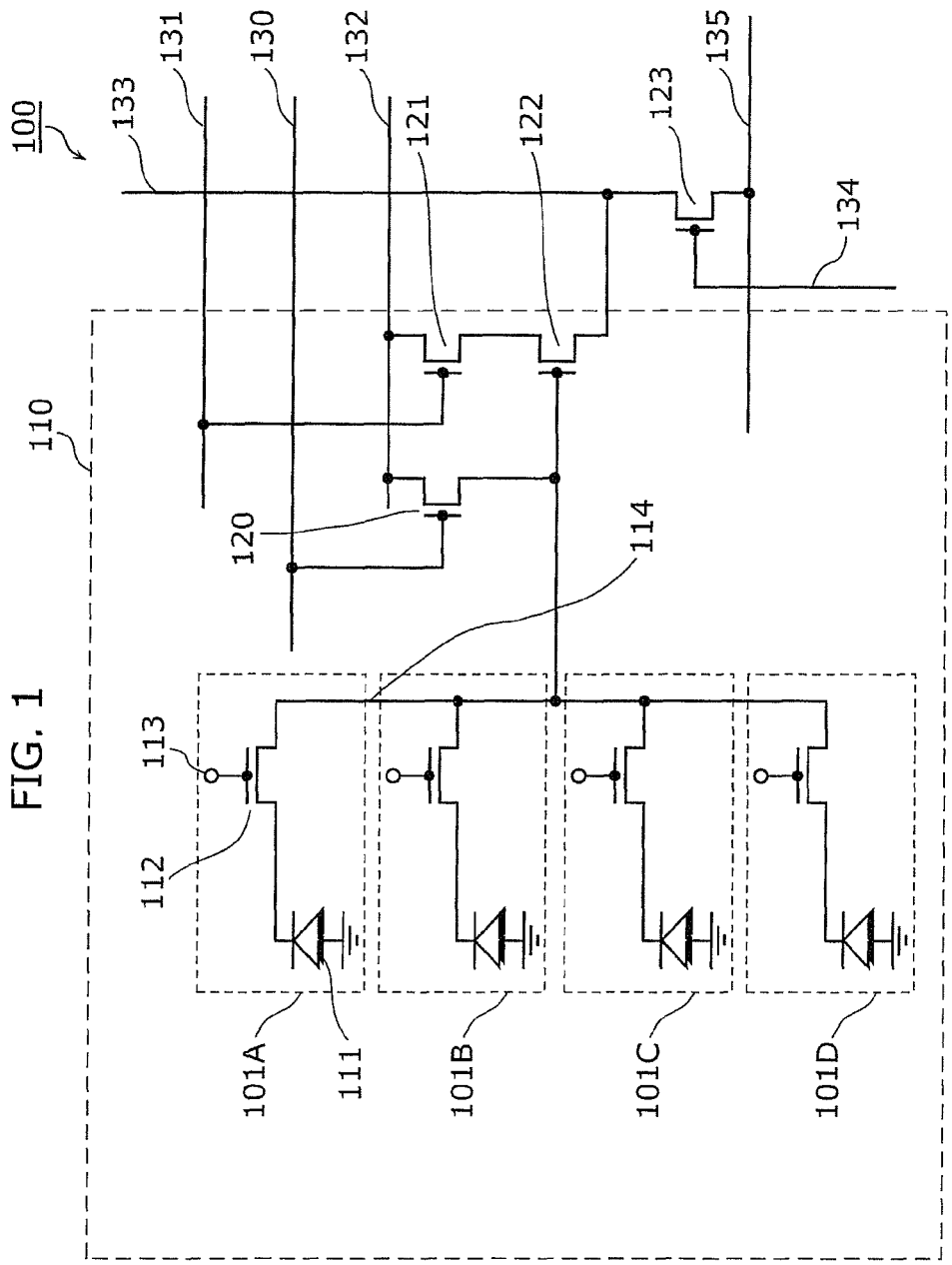
FIG. 1 is a circuit diagram indicating a configuration of a unit cell of a solid-state imaging device according to a first embodiment of the present invention.

FIG. 1 is a circuit diagram showing a configuration of a unit cell 110 in the solid-state imaging device 100 according to an embodiment of the present invention.

The unit cell 110 includes: four unit pixels 101A to 101D, a reset transistor 120, a vertical selection transistor 121, and an amplifying transistor 122. Note that the four unit pixels 101A to 101D are described as unit pixels 101 when not specifically distinguished from each other.

The unit cell 110 shown in FIG. 1 includes an FD unit 114 that is common to the four unit pixels 101A to 101D. In addition, the reset transistor 120, the vertical selection transistor 121, and the amplifying transistor 122 are shared by the four unit pixels 101A to 101D.

Each of the unit pixels 101A to 101D includes a photodiode 111 and a charge transfer gate 112.

The photodiode 111 is a photoelectric conversion unit which converts incident light into a signal charges (electrons) and accumulates converted signal charges.

A gate electrode of the charge transfer gate 112 is connected to a read signal line 113. The charge transfer gate 112 transfers the signal charges accumulated in the photodiode 111 to the FD unit 114, based on a read pulse applied to the read signal line 113.

The FD unit 114 is connected to a drain of the charge transfer gate 112 of the four unit pixels 101A to 101D. In addition, the FD unit 114 is connected to a gate electrode of the amplifying transistor 122.

The amplifying transistor 122 performs impedance conversion to convert the potential variation at the FD unit 114 into a voltage signal, and applies the voltage signal resulted from the conversion to the vertical signal line 133.

A gate electrode of the vertical selection transistor 121 is connected to the vertical selection line 131. The vertical selection transistor 121 turns ON or OFF based on a vertical selection pulse applied to the vertical selection line 131, and drives the amplifying transistor 122 for a predetermined period of time.

A gate electrode of the reset transistor 120 is connected to the vertical reset line 130. The reset transistor 120 resets the potential of the FD unit 114 to the potential of the power line 132, based on a vertical reset pulse applied to the vertical reset line 130.

Figure 13:
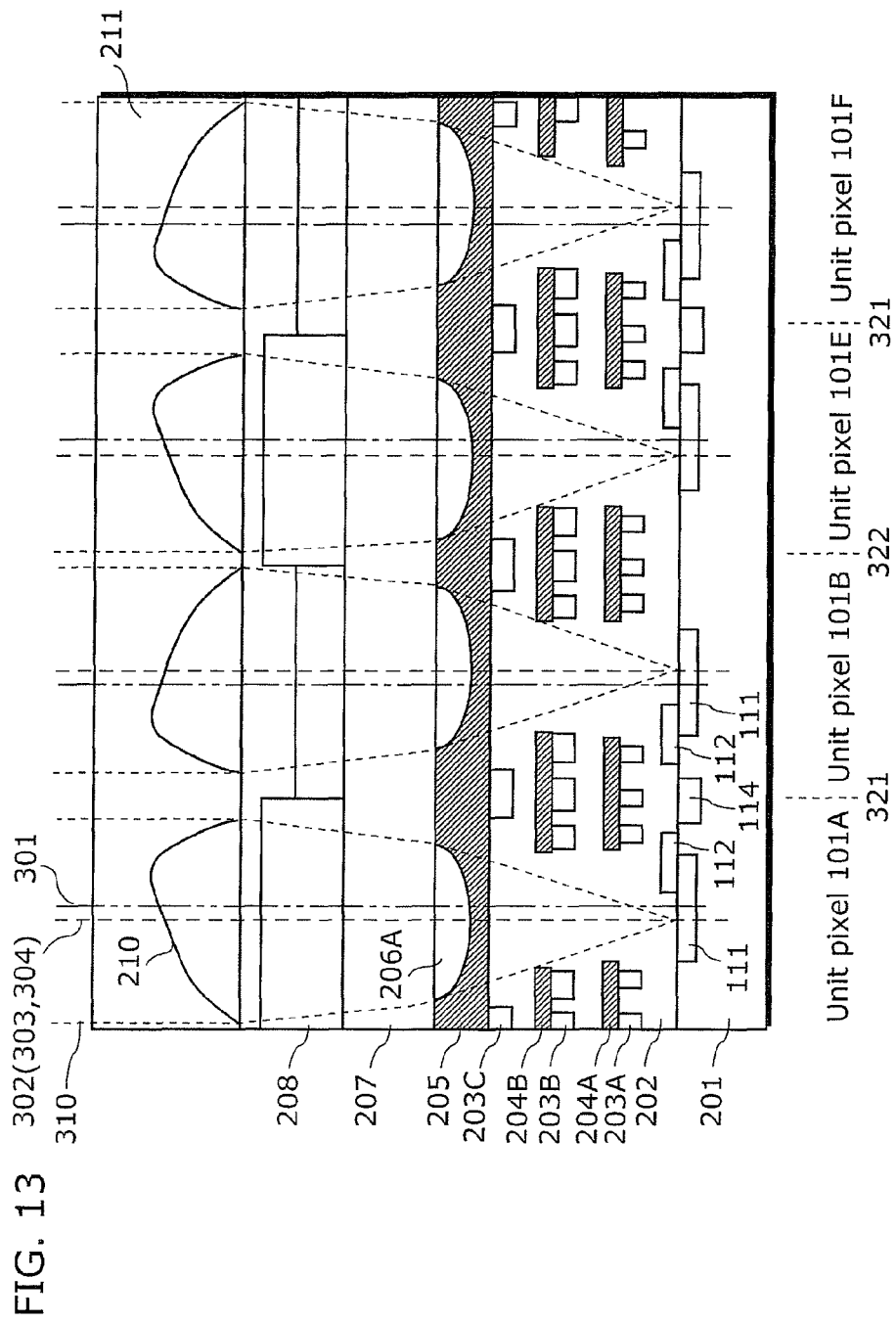
FIG. 13 is a cross-sectional view of a variation of the solid-state imaging device according to the first embodiment of the present invention.

In addition, although not shown in FIG. 1, the solid-state imaging device 100 includes, as with the solid-state imaging device 500 shown in FIG. 13, a vertical scanning circuit 140 and a horizontal scanning circuit 141. In addition, the solid-state imaging device 100 includes a plurality of unit pixels 101 (unit cells 110) arranged in a matrix.

The vertical scanning circuit 140 and the horizontal scanning circuit 141 scan the plurality of unit pixels 101 once per cycle.

Specifically, the vertical scanning circuit 140 selects, by applying a vertical selection pulse to a vertical selection line 131 for a predetermined period of time during one cycle, a row of unit cells 110 corresponding to the vertical selection line 131, that is, a set of four unit pixels 101A to 101D.

When this is performed, signal charges accumulated in the photodiode 111 in the unit pixels 101A to 101D are sequentially transmitted to the FD unit 114, according to the read pulse applied to the read line 113. The signal charge transmitted to the FD unit 114 is converted into voltage signals by the amplifying transistor 122, and the signals resulted from the conversion are sequentially applied to the vertical signal line 133.

The horizontal scanning circuit 141 selects a horizontal selection transistor 123 by sequentially applying a horizontal selection pulse to each horizontal selection line 134 for a given period of time.

The selected horizontal selection transistor 123 transmits, to the horizontal signal line 135, a signal output from the vertical signal line 133 connected to the horizontal selection transistor 123.

When the horizontal scanning circuit 141 finishes scanning all the unit pixels 101 included in one row, the vertical scanning circuit 140 applies a vertical selection pulse to the vertical selection line 131 in the next row. Next, each pixel in another row is scanned in the same manner.

By repeating the above operation to scan all the unit pixels 101 once per cycle, signals output from all the unit pixels 101 are transmitted to the horizontal signal line 135 in temporal sequence.

Thus, the solid-state imaging device 100, by having the four-pixel one-cell configuration, can reduce the number of transistors per unit pixel 101. This allows the solid-state imaging device 100 to sufficiently secure a light receiving area for the photodiode 111.

Figure 2:
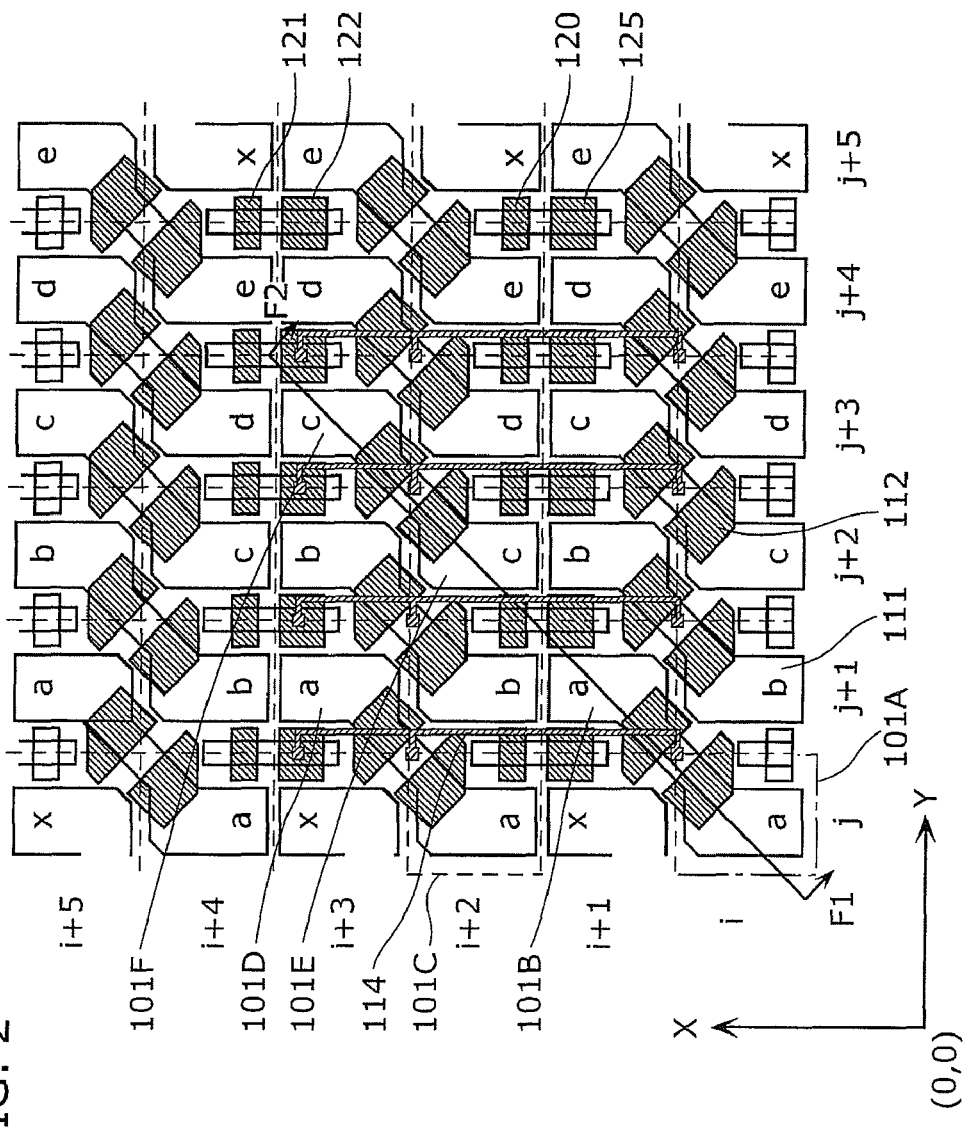
FIG. 2 is a plan view of the solid-state imaging device according to the first embodiment of the present invention.
Figure 3:
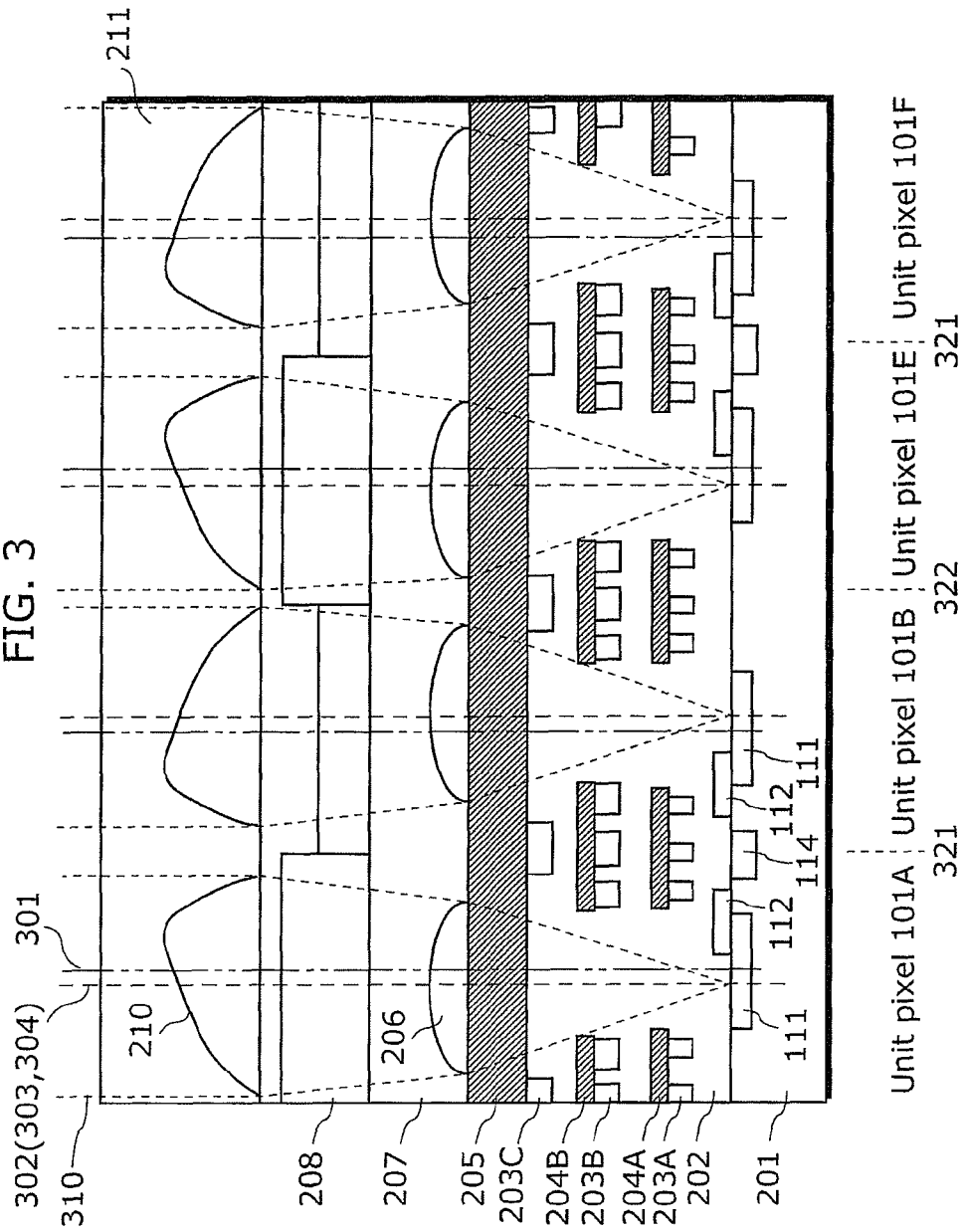
FIG. 3 is a cross-sectional view of the solid-state imaging device according to the first embodiment of the present invention.

FIG. 2 is a diagram showing a plan view of an image area captured by the solid-state imaging device 100. FIG. 3 is a cross-sectional view of the unit pixels 101A, 101B, 101E, and 101F at a section F1-F2 in FIG. 2.

Note that in FIG. 2, the same sign (a, b, c, d, . . . x) is assigned to the photodiode 111 in each of the four unit pixels 101 included in one unit cell 110. In addition, to indicate the position of the unit pixel 101, it is assumed that a set (x, y) of x (row number) indicating a lengthwise position and y (column number) indicating a crosswise position is used, based on an origin (0, 0) at the lower left.

In addition, a dummy transistor 125 shown in FIG. 2 is a gate electrode provided alongside so as to improve optical characteristics between adjacent unit pixels 101. Specifically, it is possible to reduce sensitivity difference between pixels by forming the gates, into the same or almost the same shape, in a transistor placement region where the vertical selection transistor 121 and the amplifying transistor 122 are placed and a transistor placement region where the reset transistor 120 and the dummy transistor 125 are placed. Thus, by equalizing the influence of the reflection of the light incident on the gate electrode, it is possible to reduce the sensitivity difference between pixels. Note that the dummy transistor 125 is not essential.

As shown in FIG. 3, the solid-state imaging device 100 includes: a semiconductor substrate 201, an insulation layer 202, wirings 203A to 203C, light-shielding films 204A and 204B, a passivation film 205, an intralayer lens 206, a planarizing film 207, a color filter 208, and a top lens 210, and a low refractive film 211.

The semiconductor substrate 201 is, for example, a silicon substrate.

The insulation layer 202, which is formed on the semiconductor substrate 201, is made of, for example, silicon oxide.

The wirings 203A to 203C are made of, for example, aluminum, copper, or titanium. The wiring 203A in a first layer is global wiring for applying voltage to the substrate contact (whose illustration is omitted), the charge transfer gate 112, and so on. The wiring 203B in the second layer and the wiring 203C in the third layer are local wiring for connecting the transistors between unit pixels 101, and are global wiring used for the vertical selection line 131 and the vertical signal line 133.

The wirings 203A to 203C are laid out so as to avoid, as much as possible, an upper portion of the photodiode 111. Since such layout increases an opening ratio of the photodiode 111, it is possible to introduce more light onto the photodiode 111.

The light-shielding films 204A and 204B formed on the wiring 203A and wiring 203B, respectively, prevent the light from being incident on a circuit portion including the transistor. The light-shielding films 204A and 204B are protection films made of a SiN film (n=approximately 1.8 to 2) or a SiON film (n=approximately 1.55 to 1.8).

The passivation film 205, which is formed on the insulation layer 202, is a protection film made of, for example, silicon nitride.

The intralayer lens 206, which is formed on the passivation film 205, is made of a highly-refractive material such as a SiN film (n=approximately 1.8 to 2) or a SiON film (n=approximately 1.55 to 1.8). The intralayer lens 206 is an upwardly convex lens.

The planarizing film 207, which is formed on the intralayer lens 206, is made of, for example, silicon oxide.

The color filter 208, which is formed on the planarizing film 207, transmits only light of a predetermined frequency range.

The top lens 210 is an on-chip lens formed on the color filer 208. The top lens 210 is made of: an acrylic resin (n=approximately 1.5), a SiN film (n=approximately 1.8 to 2), a SiON film (n approximately 1.55 to 1.8), or a fluoride resin.

The low refractive film 211 is formed on the top lens 210. The refractive index of the low refractive film 211 is lower than the refractive index of the top lens 210. For example, the refractive index of the low refractive film 211 is approximately 1.2 to 1.5, and the refractive index of the top lens 210 is approximately 1.5 to 1.8. For example, the low refractive film 211 is made of an acrylic resin or a fluoride resin.

The top lens 210 collects the incident light 310 transmitted through the low refractive film 211. Next, the intralayer lens 206 collects, to the photodiode 111, the incident light 310 that is collected by the top lens 210 and transmitted through the color filter 208 and the planarizing film 207.

Here, the MOS image sensor includes a larger number of wiring layers than the CCD image sensor. This results in, in the MOS image sensor, a larger distance between the surface of the semiconductor substrate 201 and the intralayer lens 206, and a larger distance between the surface of the semiconductor substrate 201 to the top lens 210 than in the CCD image censor.

In this case, it is necessary to reduce a curvature of the top lens 210 and the intralayer lens 206. This is because a larger curvature results in a light-collecting position higher than the surface of the semiconductor substrate 201. Accordingly, the incident light spreads wider on the surface of the semiconductor substrate 201, thus making it impossible to collect sufficient light to the photodiode 111.

Normally, in a 1.75-µm cell in the CCD image sensor, the height of the intralayer lens 206 is approximately 0.7 µm, and the height of the top lens 210 is approximately 0.5 µm. When these heights are directly applied to the MOS image sensor, the light-collecting position is far higher than the surface of the semiconductor substrate 201. Thus, in the MOS image sensor, it is assumed that the height of the intralayer lens 206 is approximately 0.3 µm, and the height of the top lens 210 is approximately 0.2 µm.

Here, the top lens 210 is formed by a heat flow method described later. In the heat flow method, it is very difficult to form the top lens 210 having a height of 0.5 µm or less. Thus, applying, to the top of the top lens 210, the low refractive film 211 having a lower is refractive index than the top lens 210 makes it possible to effectively reduce the refractive ratio of the top lens 210.

Note that it is preferable, although not essential, to form the low refractive index film in the configuration of the solid-state imaging device 100 according to an implementation of the present invention.

In addition, an n-type region of the photodiode 111 and an n-type region in the FD unit 114 are provided to be connected via a channel region of the charge transfer gate 112, so as to allow an efficient signal charge transfer. In this case, although the center of the photodiode 111 is almost coincident with the center 301 of the unit pixel 101, forming the charge transfer gate 112 to cover part of the top of the photodiode 111 results in displacement of a centroid 302 of the light collection in the photodiode 111 from the center 301 of the unit pixel 101.

As a result, the centroid 302 of each photodiode 111 is placed so that a section having a large pitch (section including a boundary position 321) and a section having a small pitch (section including a boundary position 322) appear alternately. For example, as shown in FIG. 3, since the unit pixel 101A and the unit pixel 101B share the FD unit 114 at the boundary position 321, the pitch at the centroid 302 of the photodiode 111 is larger. On the other hand, since the unit pixel 101B and the unit pixel 101E do not share the FD unit 114 at the boundary position 322, the pitch at the centroid 302 of the photodiode 111 is smaller.

Figure 4:
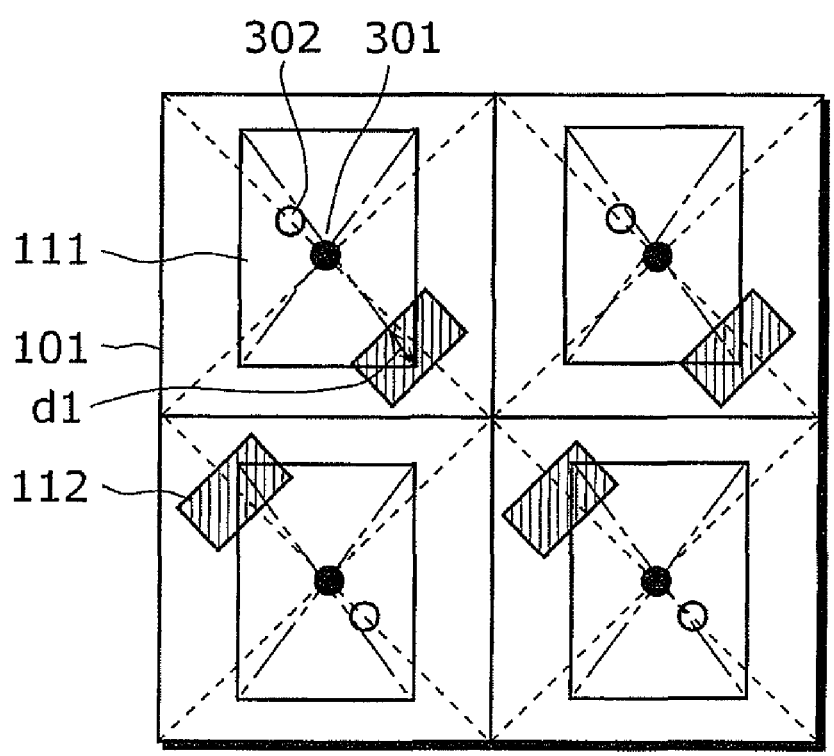
FIG. 4 is a plan view of a placement example of photodiodes in the solid-state imaging device according to the first embodiment of the present invention.

FIG. 4 is a plan view showing a placement example of the photodiode 111 in the unit pixel 101.

As shown in FIG. 4, in the case of using the four-pixel one-cell configuration, the center 301 of the unit pixel 101 and the centroid 302 of the photodiode 111 do not coincide with each other. Here, the centroid 302 of the photodiode 111 is the effective center of the light-receiving face of the photodiode 111, that is, the centroid of a region which is, in the surface of the photodiode 111, not covered by the charge transfer gate 112.

That is, in the case of using the four-pixel one-cell configuration, the placement of the charge transfer gates 112 is different between adjacent unit pixels 101. Accordingly, the position of the centroid 302 of the photodiode 111 is different from each other.

In addition, for example, the center of the photodiode 111 is almost coincident with the center 301 of the unit pixel 101. Here, the center of the photodiode 111 is the center of the photodiode 111 including a region in which the charge transfer gate 112 is formed.

Figure 5A:
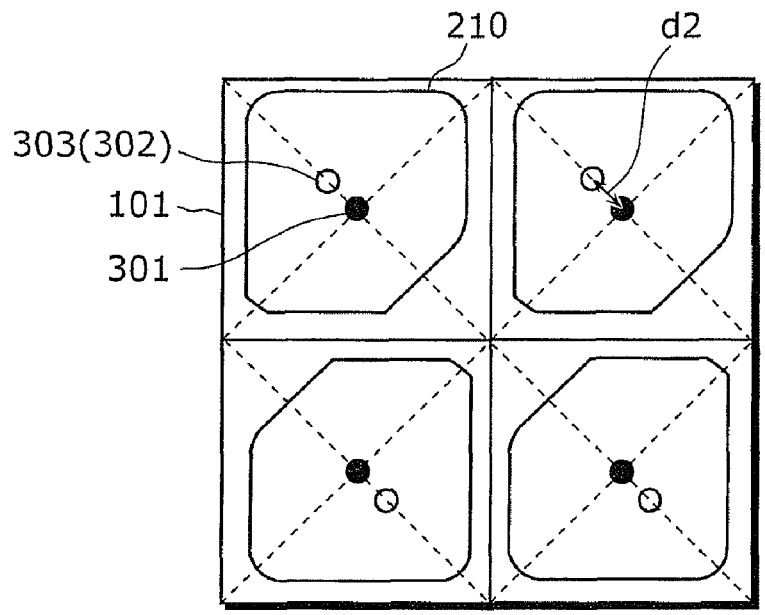
FIG. 5A is a plan view of a placement example of a top lens in the solid-state imaging device according to the first embodiment of the present invention.

FIG. 5A is a plan view showing a placement example of the top lens 210.

As shown in FIG. 5A, the centroid 303 of the top lens 210 is almost coincident with the centroid 302 of the photodiode 111. Here, the centroid 303 of the top lens 210 is an optical centroid of the top lens 210, that is, a center position (focal position (optical axis)) at which light perpendicular to the photodiode 111 is collected by the top lens 210. For example, as shown in FIG. 5A, the centroid 303 of the top lens 210 is adjusted by placing the top lens 210 at almost the same placement position (center position) in the plural unit pixels 101 and changing a shape (orientation) of the top lens 210.

Specifically, the shape of the top lens 210 is asymmetric with respect to a face which is perpendicular to the surface of the semiconductor substrate 201 (photodiode 111), perpendicular to a direction in which the centroid 303 of the top lens 210 is displaced (hereinafter, a displacement direction), and which includes the center 301 of the unit pixel 101. In addition, the shape of the top lens 210 is symmetric with respect to a face which is perpendicular to the surface of the semiconductor substrate 201 and is laterally located along the displacement direction, and which includes the center 301 of the unit pixel 101.

In addition, an invalid region in which the top lens 210 is not formed is smaller in the displacement direction (direction from the center 301 of the unit pixel 101 toward the centroid 303 of the top lens 210) and is larger in a direction opposite to the displacement direction. That is, the invalid region at the end of a side opposite to the displacement direction in the unit pixel 101 is wider than the invalid region at the end of the displacement direction in the unit pixel 101.

Note that the placement position may be changed in addition to the shape of the top lens 210.

Figure 5B:
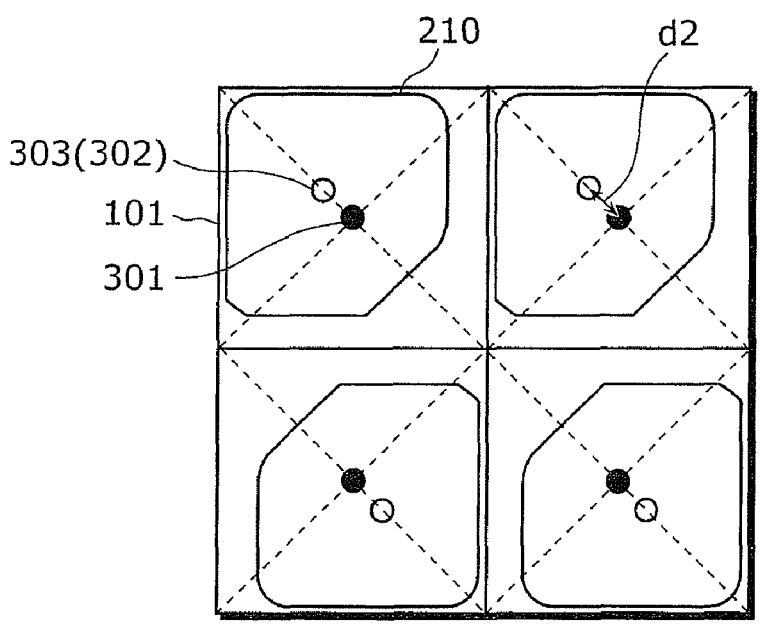
FIG. 5B is a plan view of a placement example of the top lens in a variation of the solid-state imaging device according to the first embodiment of the present invention.

FIG. 5B is a plan view showing a placement example of the top lens 210 in the case of changing the shape and placement position of the top lens 210. As shown in FIG. 5B, the centroid 303 of the top lens 210 may be matched with the centroid 302 of the photodiode 111 by displacing the placement position of the top lens 210 in the displacement direction and then adjusting the shape of the top lens 210 with the placement position of the top lens 210.

Note that only the placement position may be adjusted, after forming top lens 210 into almost the same shape.

Figure 6:
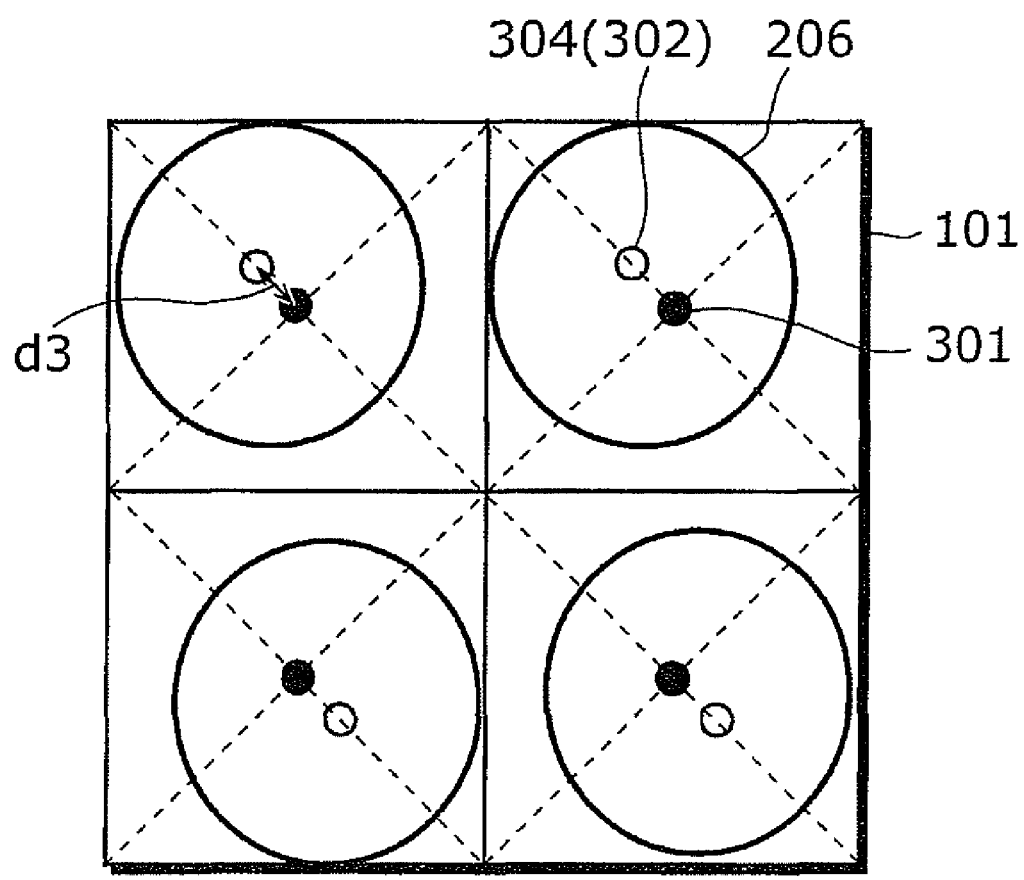
FIG. 6 is a diagram showing a placement example of an intralayer lens in the solid-state imaging device according to the first embodiment of the present invention.

FIG. 6 is a plan view showing a placement example of the intralayer lens 206.

As shown in FIG. 6, the centroid 304 of the intralayer lens 206 is almost coincident with the centroid 302 of the photodiode 111. The centroid 304 of the intralayer lens 206 is an optical centroid of the intralayer lens 206, that is, a center position (focal position (optical axis)) at which the light perpendicular to the photodiode 111 is collected by the intralayer lens 206. For example, as shown in FIG. 6, the centroid 304 of the intralayer lens 206 is adjusted by forming the intralayer lens 206 into almost the same shape in the plural unit pixels 101 and changing the placement position (center position) of the intralayer lens 206. In addition, the shape of the intralayer lens 206 is point-symmetric with respect to the centroid 304 of the intralayer lens 206. Note that, the shape of the intralayer lens 206 may be changed with almost the same placement position, or both the shape and placement position may be changed.

In addition, the photodiode 111 in the unit pixel (i, j) 101A and the photodiode 111 in the unit pixel (i+1, j+1) 101B are placed point-symmetric with respect to the FD unit 114 as a center. Likewise, each photodiode 111 in an i-th row is placed point-symmetric to a photodiode in an (i+1)th row in an immediately right column with respect to the FD unit 114 as a center.

Accordingly, the centroid 304 of the intralayer lens 206 and the centroid 303 of the top lens 210 are displaced. Specifically, the centroid 304 of the intralayer lens 206 and the centroid 303 of the top lens 210 are displaced in the same direction as the direction in which the photodiode 111 is displaced. In this case, the direction in which the centroid 304 of the intralayer lens 206 and the centroid 303 of the top lens 210 are displaced in the unit pixel in the i-th row is opposite to the direction in which those are displaced in the photodiode 111 in the (i+1)th row in the immediately right column.

That is, the placement is to: narrow a space between each centroid 303 of the top lens 210 and each centroid 304 of the intralayer lens 206 at a point where a space between each centroid 302 of the photodiode 111 is narrower; and widen the space between each centroid 303 of the top lens 210 and each centroid 304 of the intralayer lens 206 at a point where the space between each centroid 302 of the photodiode is wider.

As described above, in the solid-state imaging device 100 according to the first embodiment of the present invention, the centroid 303 of the top lens 210 and the centroid 304 of the intralayer lens 206 are placed so as to be almost coincident with the centroid 302 of the photodiode 111. With this, the incident light 310 falling on the top lens 210 in parallel with the optical axis is collected to a region near the centroid 302 of the photodiode 111 through the top lens 210 and the intralayer lens 206. Thus, the solid-state imaging device 100 can effectively collect incident light.

Furthermore, since, in each unit pixel 101, the centroid 302 of the photodiode 111 is almost coincident with the centroid 303 of the top lens 210 and the centroid 304 of the intralayer lens 206, the charge transfer gate 112 provided on top of the shared region of the semiconductor substrate is less likely to cause vignetting (reflection) or absorb part of the light collected by the top lens 210 and the intralayer lens 206. Thus, it is possible to reduce unevenness in the amount of incident light between each unit pixel 101. This allows the solid-state imaging device 100 to achieve evenness of sensitivity between each unit pixel 101, thus obtaining preferable imaging characteristics. Furthermore, the solid-state imaging device 100 can reduce color mixing caused by leakage of the reflected light into an adjacent unit pixel 101, by suppressing such vignetting of light to a minimum.

Furthermore, with the top lens 210 formed in an asymmetric shape, the solid-state imaging device 100 displaces the centroid 303 of the top lens 210 in the displacement direction. Here, in the case of displacing only the placement position in the displacement direction without changing the shape of the top lens 210, due to the difference in the displacement direction between adjacent unit pixels 101, it is necessary to reduce the area of the top lens 210 compared to the case of placing the top lens 210 in the center 301 of the unit pixel 101. On the other hand, in the solid-state imaging device 100, it is not necessary to displace the placement position of the top lens 210 (or it is possible to reduce the amount of the displacement) when using the top lens 210 having an asymmetric shape. Thus, the solid-state imaging device 100 can suppress decrease in the area of the top lens 210 as a result of displacing the centroid 303 of the top lens 210.

In addition, not only the intralayer lens 206 and the top lens 210 but also the wirings 203A to 203C may also be displaced to match the centroid 302 of the photodiode 111. With this, it is possible to reduce vignetting caused by the wirings 203A to 203C.

Note that the centroid 303 of the top lens 210 and the centroid 302 of the photodiode 111 may not necessarily be coincident with each other, and the centroid 304 of the intralayer lens 206 and the centroid 302 of the photodiode 111 may not necessarily be coincident with each other.

For example, it is only necessary to displace the centroid 303 of the top lens 210 and the centroid 304 of the intralayer lens 206 from the center (the center 301 of the unit pixel 101) of the photodiode 111 toward the centroid 302 of the photodiode 111. This increases the amount of light incident on the photodiode 111 and reduces unevenness of sensitivity between unit pixels 101.

In other words, the centroid 304 of the intralayer lens 206 and the centroid 303 of the top lens 210 are displaced, with respect to the center of the photodiode 111, in a direction opposite to the direction in which the charge transfer gate 112 is placed. For example, in the examples shown in FIGS. 4 to 6, the centroid 303 of the top lens 210 and the centroid 304 of the intralayer lens 206 are displaced in the direction (in an upper left direction of the unit pixel 101 on the upper left) opposite to the direction in which the charge transfer gate 112 is formed in a diagonal direction of the unit pixel 101. Note that the centroid 303 of the top lens 210 and the centroid 304 of the intralayer lens 206 are displaced in the direction opposite to the direction in which the charge transfer gate 112 is formed in a diagonal direction of the photodiode 111.

Here, where d1 is a length of overlapping portions of the photodiode 111 and the charge transfer gate 112 in a channel length direction (transfer direction) of the charge transfer gate 112, a displacement amount d2 of the top lens 210 from the center of the photodiode 111 (the center 301 of the unit pixel 101) and a displacement amount d3 of the intralayer lens 206 from the center of the photodiode 111 are represented by, for example, d1/2.

For example, where the pixel size is 1.75 µm on a side, d1=approximately 200 nm, and d2=d3=100 nm accordingly. However, the displacement amounts d2 and d3 may not necessary be equal. For example, in the case of collecting light with two lenses, the displacement amounts of the centroid 303 of the top lens 210 and the centroid 304 of the intralayer lens 206 may be different such that the focal position almost coincides with the centroid 302 of the photodiode 111. For example, the displacement amounts d2 and d3 only need to satisfy a relationship: d3>d1/2>d2, or d2>d1/2>d3.

Next, a method of manufacturing the solid-state imaging device 100 will be described.

Note that the manufacturing method, except for the method of manufacturing the intralayer lens 206 and the top lens 210 that is a feature of the present invention, is the same as the conventional method, and the description thereof will therefore be omitted.

FIGS. 7A to 7D are diagrams for describing the method of manufacturing the intralayer lens 206.

Figure 7A:
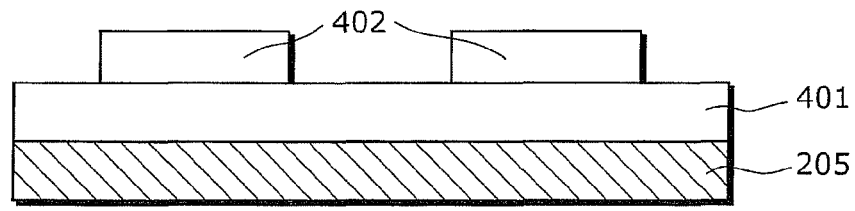
FIG. 7A is a diagram for describing a method of manufacturing the intralayer lens in the solid-state imaging device according to the first embodiment of the present invention.

First, as shown in FIG. 7A, a silicon nitride layer 401 is formed on the passivation film 205. Next, a resist 402 is formed on the silicon nitride layer 401.

Figure 7B:
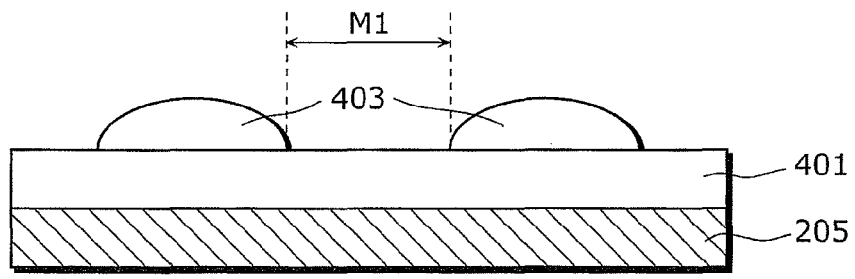
FIG. 7B is a diagram for describing a method of manufacturing the intralayer lens in the solid-state imaging device according to the first embodiment of the present invention.

Next, by performing resist reflow, a resist 403 having a convex shape is formed as shown in FIG. 7B.

Figure 7C:
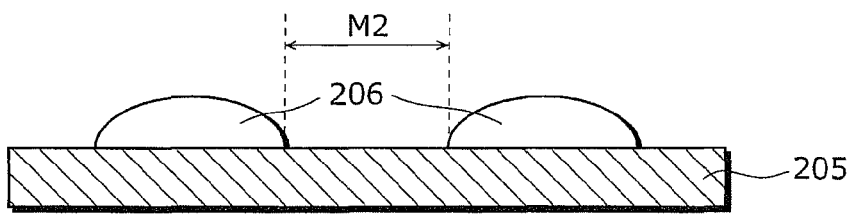
FIG. 7C is a diagram for describing a method of manufacturing the intralayer lens in the solid-state imaging device according to the first embodiment of the present invention.

Next, by performing etch back, the intralayer lens 206 having a convex shape is formed as shown in FIG. 7C.

Here, the smaller a distance M2 between each intralayer lens 206 after the etch back is, the further the area of each intra layer lens 206 increases. This improves the light collection ratio. However, in the case of the pixel cell of 1.75 µm on a side, it is difficult to form the intralayer lens 206 with a distance M2 of 700 nm or less. This is because the resist 402 is isotropically etched, and this increases the distance M2 between each intra layer lens 206 after the etch back.

Figure 7D:
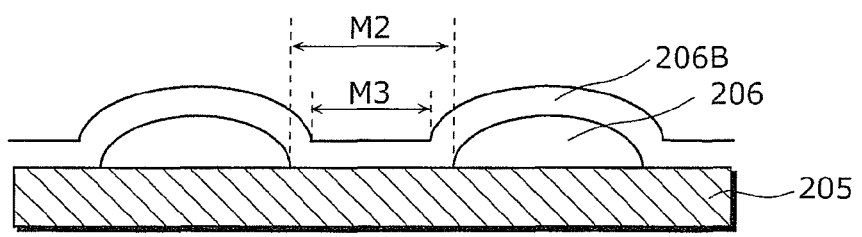
FIG. 7D is a diagram for describing a method of manufacturing the intralayer lens in the solid-state imaging device according to the first embodiment of the present invention.

To deal with this, as shown in FIG. 7D, a deposited film 206B may be further deposited on the intralayer lens 206 after the etch back of the intralayer lens 206. This reduces the distance between each intralayer lens 206 (the intralayer lens 206 and the deposited film 206B) from M2 to M3, thus allowing the area of the intralayer lens 206 to increase. For example, in the case of the pixel cell of 1.75 µm on a side, it is preferable that the distance M3 between each intralayer lens 206 be approximately 300 nm. When the distance M3 is further increased, a curvature of an edge of the intralayer 206 decreases compared to the curvature near the center of the intralayer lens 206. This decreases the light collection ratio of the intralayer lens 206 accordingly.

FIGS. 8A, 8B, 9A, and 9B are diagrams showing the method of manufacturing the top lens 210.

Figure 8A:
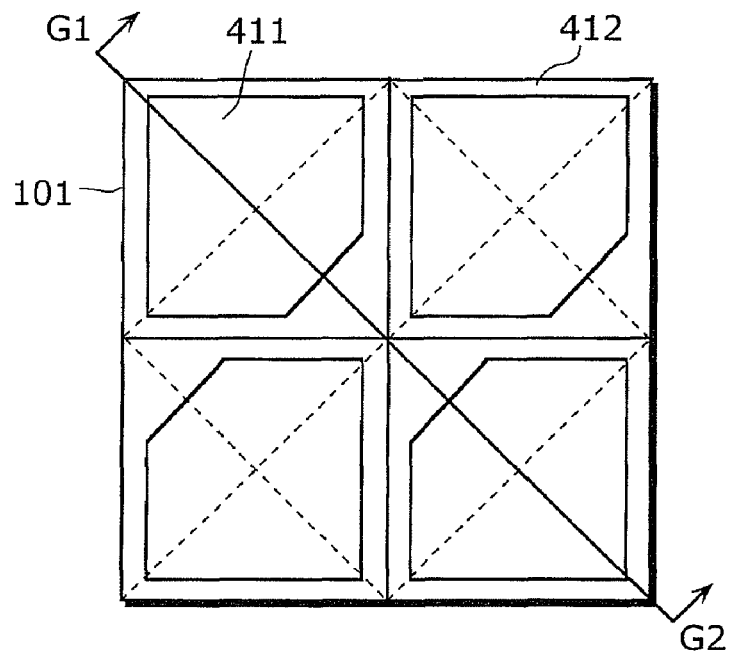
FIG. 8A is a plan view showing a resist pattern used for forming the top lens in the solid-state imaging device according to the first embodiment of the present invention.
Figure 8B:
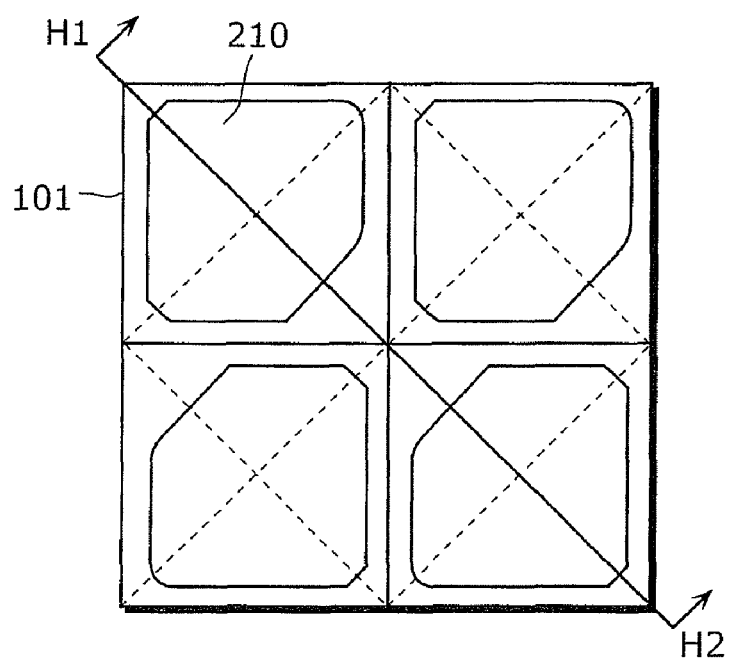
FIG. 8B is a plan view of the top lens in the solid-state imaging device according to the first embodiment of the present invention.
Figure 9A:
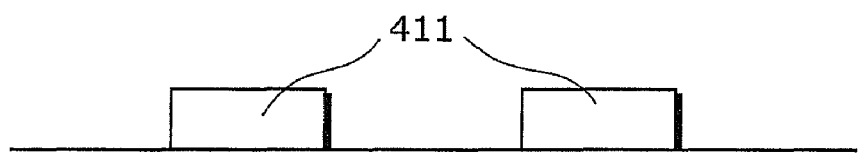
FIG. 9A is a diagram for describing a method of manufacturing the top lens in the solid-state imaging device according to the first embodiment of the present invention.
Figure 9B:
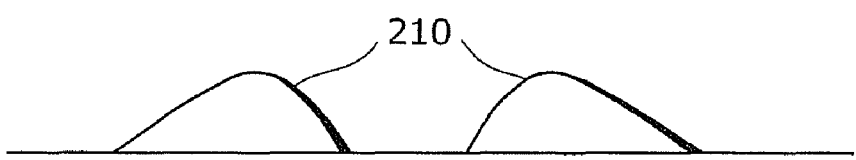
FIG. 9B is a diagram for describing a method of manufacturing the top lens in the solid-state imaging device according to the first embodiment of the present invention.

FIG. 8A is a plan view showing a resist pattern used for forming the top lens 210. FIG. 9A is a cross-sectional view of a section G1-G2 in FIG. 8A. FIG. 8B is a plan view of the top lens 210 formed by the manufacturing method. FIG. 9B is a cross-sectional view of a section H1-H2 in FIG. 8B.

The top lens 210 is formed using a heat flow method.

First, on the planarizing film on the color filter 208, a lens material including an inorganic or organic transparent material is formed. Next, a positive resist is formed on the lens material that is formed. Here, as shown in FIG. 8A, a mask layout 412 of the positive resist has a shape which is line-symmetric with respect to a center line that is a diagonal line laterally extended along the displacement direction of the unit pixel 101 (the line in the displacement direction, including the center 301 of the unit pixel 101), and is also asymmetric with respect to a center line that is a diagonal line orthogonal to the displacement direction (the line in the direction orthogonal to the displacement direction, including the center 301 of the unit pixel 101). Specifically, the mask layout 412 has a shape of a pentagon that is formed by cutting off one of opposite angles of a square (rectangle). Here, the angle to be cut off from the square is an angle located opposite to the displacement direction.

By performing patterning using the mask layout 412, a photoresist 411 as shown in FIG. 9A is formed.

Next, by performing reflow on the photoresist 411 at a required temperature, the surface of the photoresist 411 is formed into a curved convex shape. As a result, as shown in FIGS. 8B and 9B, the top lens 210, which is asymmetric and has a curved convex portion, is formed.

Here, when the temperature for heat processing in the reflow is set too high, the lens material completely dissolves to be formed into a structure including no displacement, which has a flat shape in all directions; thus, it is necessary to perform reflow at an optimum heat processing temperature (200 degrees centigrade or so).

Conventionally, in forming such an asymmetric lens, use of a gray scale mask is suggested. In the gray scale mask, plural unit patterns are two-dimensionally formed. Each of the unit patterns in the mask has an asymmetric transmissivity distribution. However, manufacturing the gray scale mask requires an advanced technique and extremely high costs.

On the other hand, use of the manufacturing method according to the first embodiment of the present invention allows manufacturing of the asymmetric lens at low costs.

Next, the following will describe a detailed configuration of the top lens 210 formed by the manufacturing method above.

In the case where the lens is made up of two layers, that is, the top lens 210 and the intralayer lens 206, the top lens 210 guides the light incident on the pixel to the intralayer lens 206, and the intralayer lens 206 guides the light to the photodiode 111.

In this case, in order to allow the top lens 210 to guide the light incident on the pixel to the intra layer 206 at a highest possible ratio, the top lens 210 is formed in contact with an adjacent top lens 210.

Figure 10A:
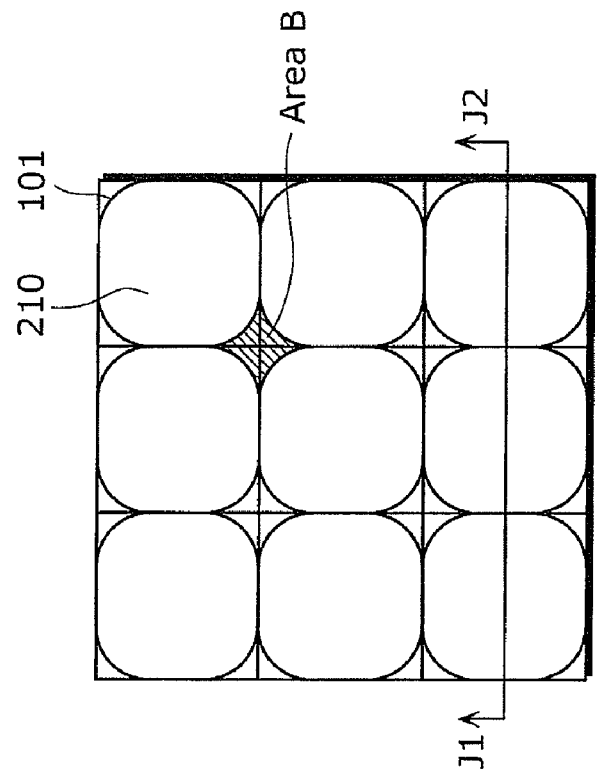
FIG. 10A is a plan view of the case where the top lens does not contact another top lens in the solid-state imaging device according to the first embodiment of the present invention.
Figure 10B:
FIG. 10B is a cross-sectional view of the case where the top lens does not contact another top lens in the solid-state imaging device according to the first embodiment of the present invention.
Figure 10C:
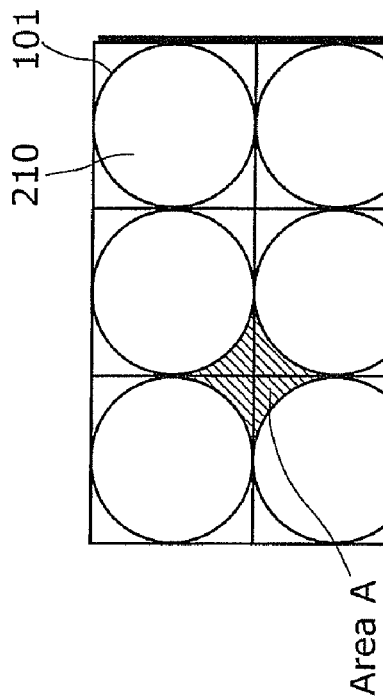
FIG. 10C is a plan view of the case where the top lens contacts another top lens in the solid-state imaging device according to the first embodiment of the present invention.
Figure 10D:
FIG. 10D is a plan view of the case where the top lens contacts another top lens in the solid-state imaging device according to the first embodiment of the present invention.

FIG. 10A is a plan view in the case where the top lenses 210 do not contact each other between adjacent unit pixels. FIG. 10B is a cross-sectional view of a section I1-I2 in FIG. 10A. FIG. 10C is a plan view in the case where the top lenses 210 contact each other between adjacent unit pixels. FIG. 10D is a cross-sectional view of a section J1-J2 in FIG. 10C. Note that the lens has a circular shape for the sake of description.

As shown in FIGS. 10C and 10D, when the top lenses 210 contact each other, the curvature of the lens decreases particularly near the boundary of the unit pixels 101. This results in a smaller curvature of the top lens 210 in the horizontal and vertical directions (lengthwise and crosswise directions of FIGS. 10A and 10C) than in the diagonal direction (an oblique direction of FIGS. 10A and 10C).

On the other hand, area B of a region in which no lens is formed when the top lenses 210 contact each other is smaller than area A of a region in which no lens is formed when the top lenses 210 do not contact each other. That is, by providing top lenses 210 in contact with each other, it is possible to increase the area of the top lens 210.

Figure 11:
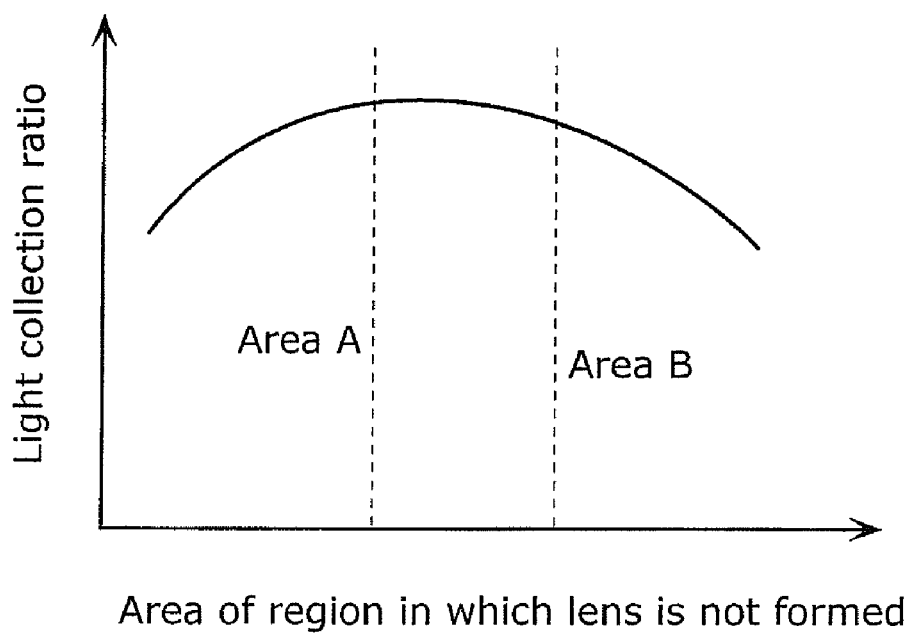
FIG. 11 is a graph showing a relationship between a light collection ratio and a region in which the top lens is not formed in the solid-state imaging device according to the first embodiment of the present invention.

FIG. 11 is a graph showing a relationship between the area of the region in which the top lens 210 is not formed and the light collection ratio.

Generally, by reducing the area of the region in which the top lens 210 is not formed, the light collection ratio increases up to a predetermined area. However, when the area of the region in which the top lens 210 is not formed is equal to or less than the predetermined area, adjacent top lenses 210 contact each other. This decreases the curvature of the top lens 210 at a portion where the adjacent top lenses 210 contact each other. Thus, the light collection ratio of the top lens 210 is decreased.

On the other hand, when the area is too small, the focal position in the horizontal direction is closer to an upper surface of the substrate, so that the light is reflected by the wiring 203A in the first layer and the wiring 203B in the second layer, thus decreasing the light collection ratio. That is, the area of the region in which the top lens 210 is not formed has an optimal value. Normally, in the case of a 1.75-μm cell, the optimal value for the area is approximately 0.09 μm². That is, the optimal ratio of the area of the region in which the top lens is not formed, in the area of the entire cell, is approximately 3% to 5%.

By thus forming the top lens 210 and the intralayer lens 206, it is possible to increase the light collection ratio to a maximum extent.

Figure 12:
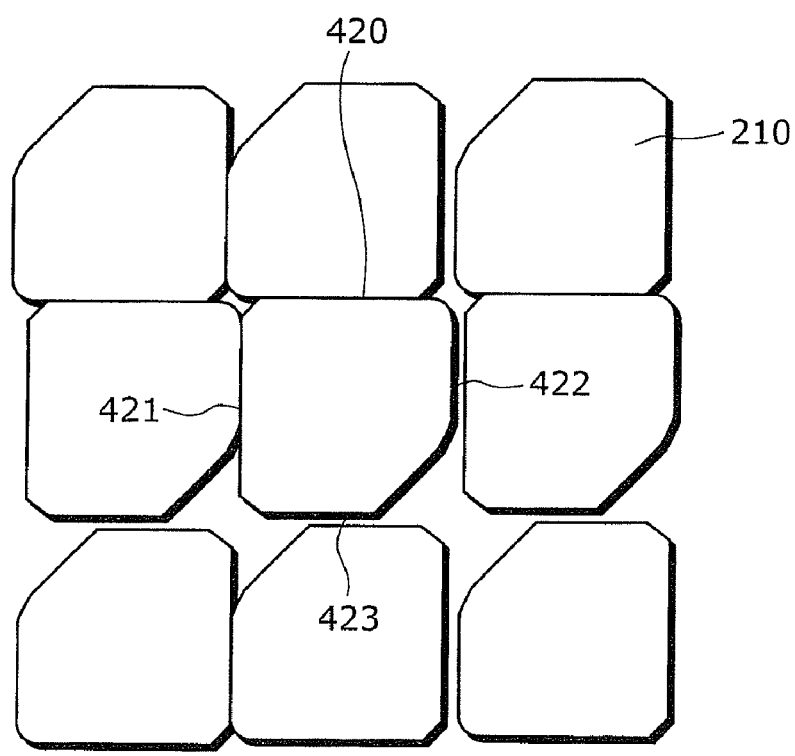
FIG. 12 is a plan view of the top lens in the solid-state imaging device according to the first embodiment of the present invention.

FIG. 12 is a plan view of the top lens 210.

For example, as shown in FIG. 12, the top lens 210 contacts the top lenses 210 of the adjacent unit pixels 101 at boundaries 420 and 421 in two directions, and does not contact the top lenses 210 of the adjacent unit pixels 101 at boundaries 422 and 423 in the other two directions. Specifically, the top lens 210 contacts, of the top lenses 210 of the four adjacent unit pixels 101, the top lenses 210 of two unit pixels 101 located in the displacement direction, and does not contact the top lenses 210 of the other two unit pixels 101 located in the direction opposite to the displacement direction. By forming the top lens 210 into such a structure, it is possible to maximize the light collection ratio.

As described above, the solid-state imaging device 100 according to an embodiment of the present invention has been described, but the present invention is not limited to the embodiment.

For example, the intralayer lens 206 may be a lens having a concave shape (downwardly convex). FIG. 13 is a cross-sectional view showing a configuration of a variation of the solid-state imaging device 100 according to the first embodiment of the present invention.

As shown in FIG. 13, the solid-state imaging device 100 may include an intralayer lens 206A having a concave shape. Use of the concave lens allows a smaller distance between the surface of the semiconductor substrate 201 and the intralayer lens 206A, and a smaller distance between the surface of the semiconductor substrate 201 and the top lens 210 than in the case of using the convex lens. Specifically, it is possible to decrease the distance between the surface of the semiconductor substrate 201 and the intralayer lens 206A from 4 μm to 3 μm, and to decrease the distance between the surface of the semiconductor substrate 201 and the top lens 210 from 5 μm to 4 μm. This facilitates collecting the incident light to the photodiode 111.

In addition, the above description shows an example of the solid-state imaging device 100 using two lenses, that is, the top lens 210 and the intralayer lens 206, but a single lens may be used. Alternatively, the solid-state imaging device 100 may use three or more lenses.

In addition, the above description shows the solid-state imaging device 100 having a four-pixel one-cell configuration, but the present invention is not limited to this. For example, the solid-state imaging device 100 may have a two-pixel one-cell configuration, or may have a configuration in which one cell is made up of four pixels or more.

In addition, the present invention may be applied to a CCD image sensor.

Second Embodiment

A second embodiment of the present invention will describe a solid-state imaging device which can increase an amount of light incident on a periphery of a pixel array, in addition to the features of the solid-state imaging device 100 according to the first embodiment.

Figure 14:
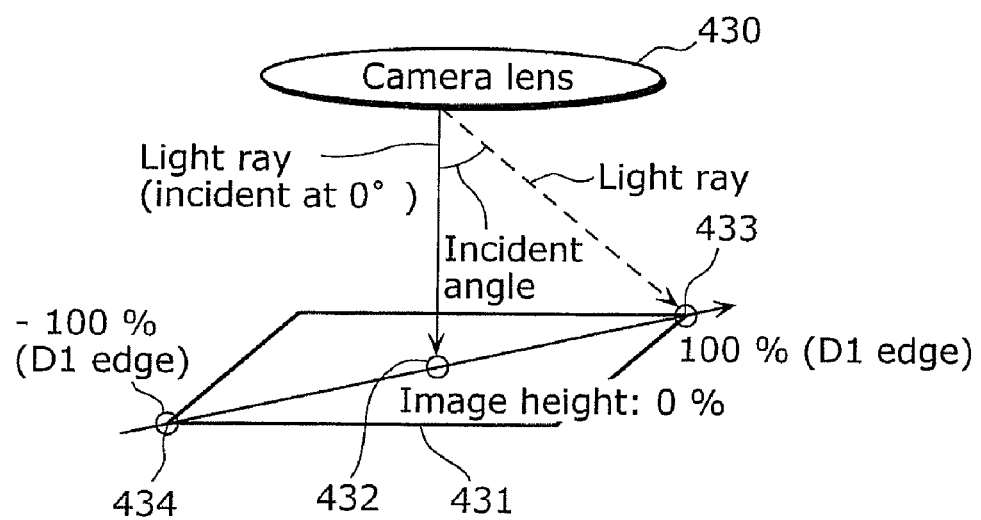
FIG. 14 is a diagram showing a schematic configuration of an imaging device according to a second embodiment of the present invention.

FIG. 14 shows a schematic configuration of an imaging device (camera) including the solid-state imaging device 100 according the first embodiment of the present invention, and is particularly a diagram showing a relationship between a camera lens 430, a pixel array 431, and an incident angle of a light ray.

As shown in FIG. 14, in a center portion 432 of the pixel array (imaging area) 431, the incident light is perpendicularly incident on the semiconductor substrate 201 (at an angle of 0°). On the other hand, an oblique ray (approximately at an angle of 25°) is incident on peripheries 433 and 434 of the pixel array 431.

Recently, the image sensor has been more miniaturized, and the aspect ratio (a space-to-depth ratio of an opening of the photodiode 111) of the pixel unit has increased accordingly, thus increasing an oblique component of the light incident on the peripheries 433 and 434.

In this context, the second embodiment of the present invention will describe a solid-state imaging device 100 in which the intra layer lens 206 and the wirings 203A to 203C are displaced further toward the center potion 432 of the pixel array 431 with respect to the center 301 of the pixel unit 101, as viewed along the direction from the center portion 432 of the pixel array 431 toward the peripheries 433 and 434 of the pixel array 431 where the oblique component of the incident light increases, the top lens 210.

Figure 15B:
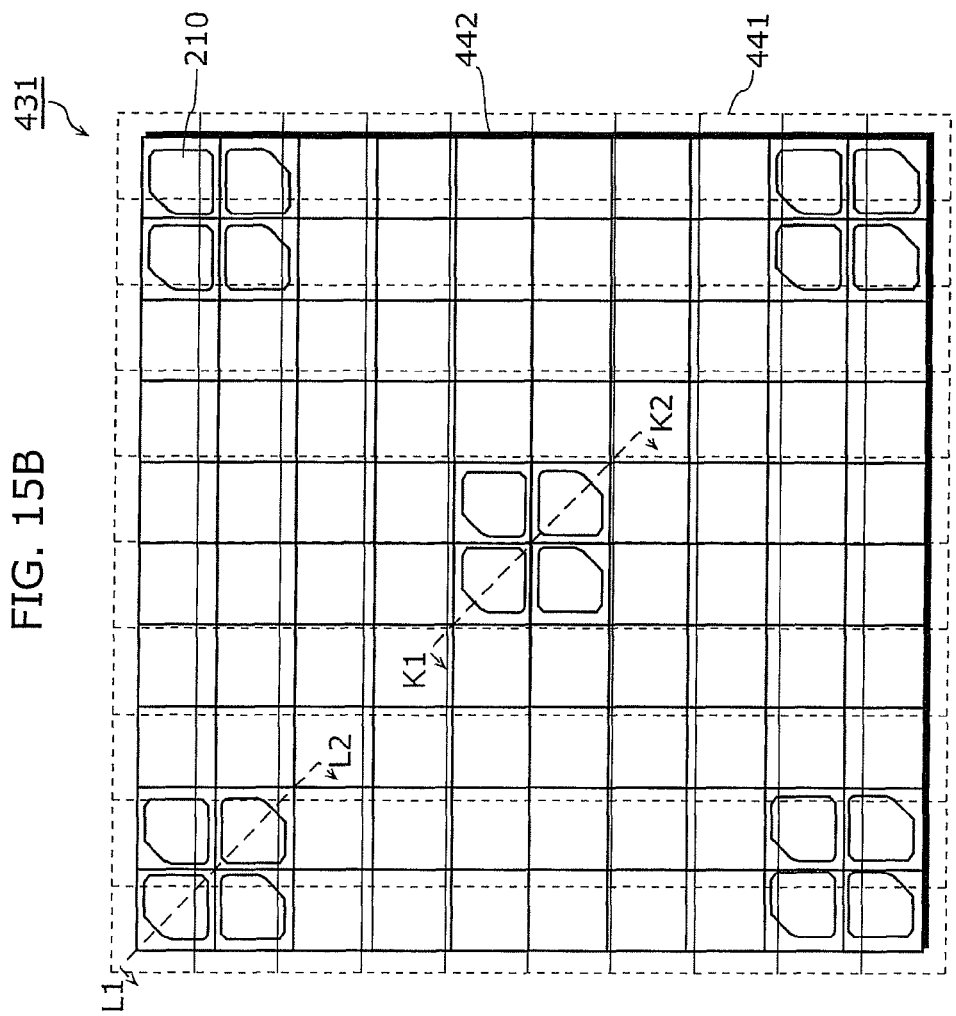
FIG. 15B is a plan view showing a placement of the top lens in the pixel array according to the second embodiment of the present invention.
Figure 17:
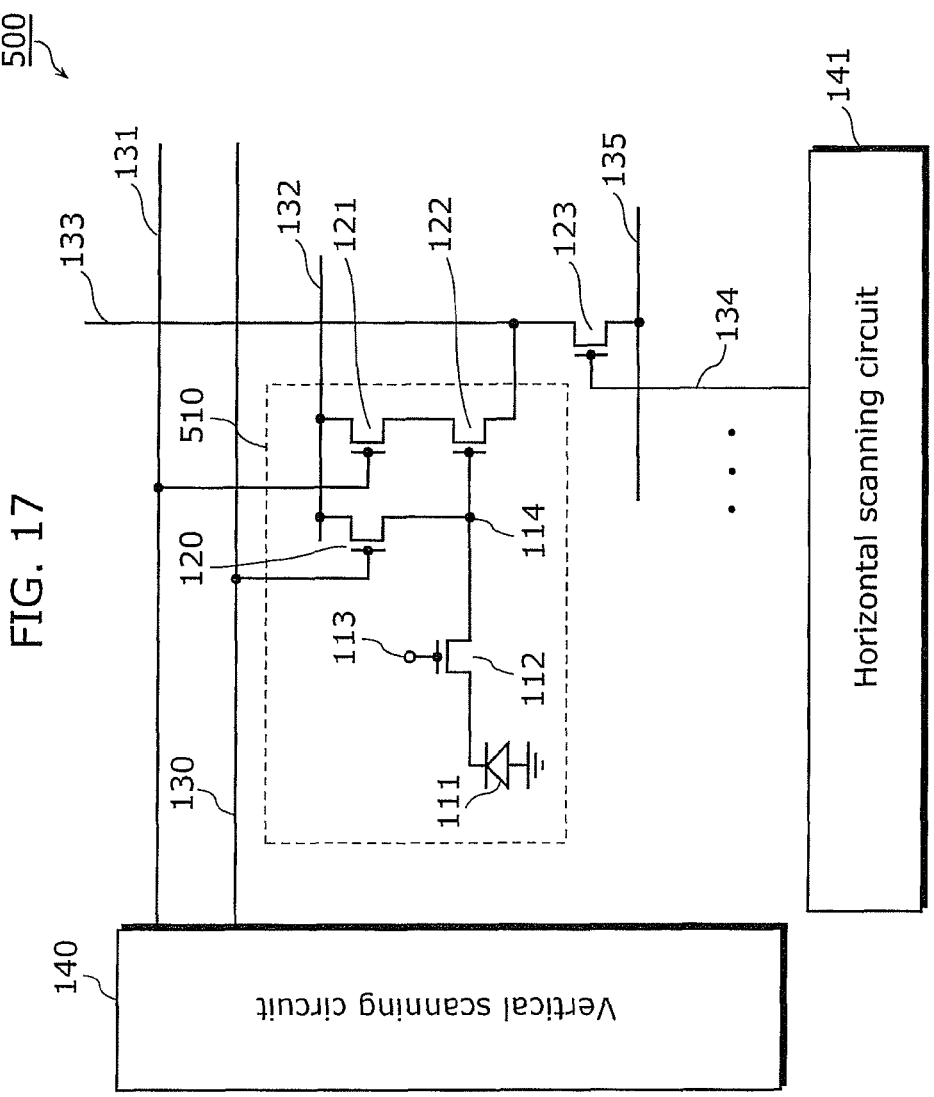
FIG. 17 is a circuit diagram showing a configuration of a unit pixel of a conventional solid-state imaging device.
Figure 18:
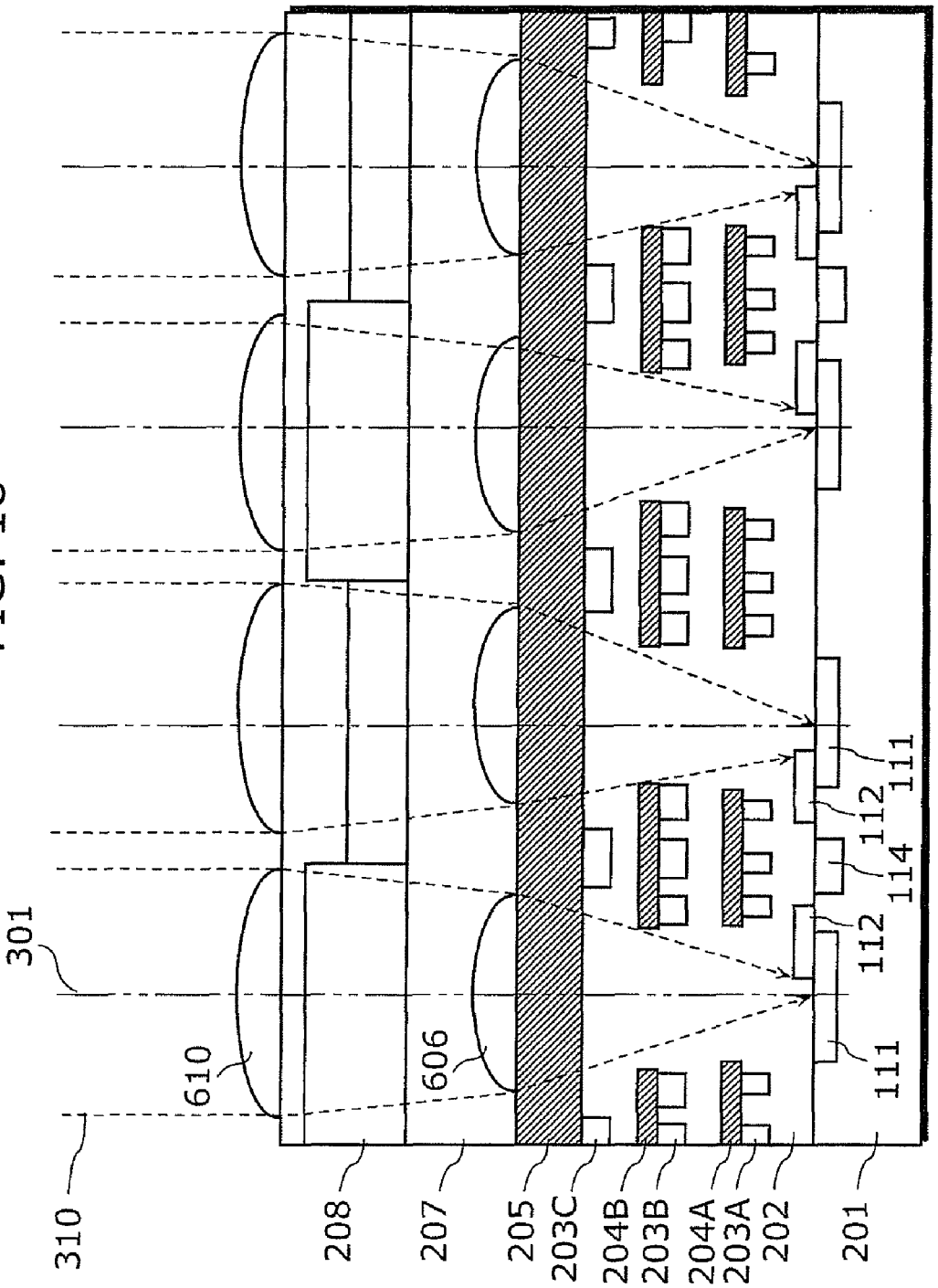
FIG. 18 is a cross-sectional view showing a configuration of an imaging area in the conventional solid-state imaging device.
Figure 19:
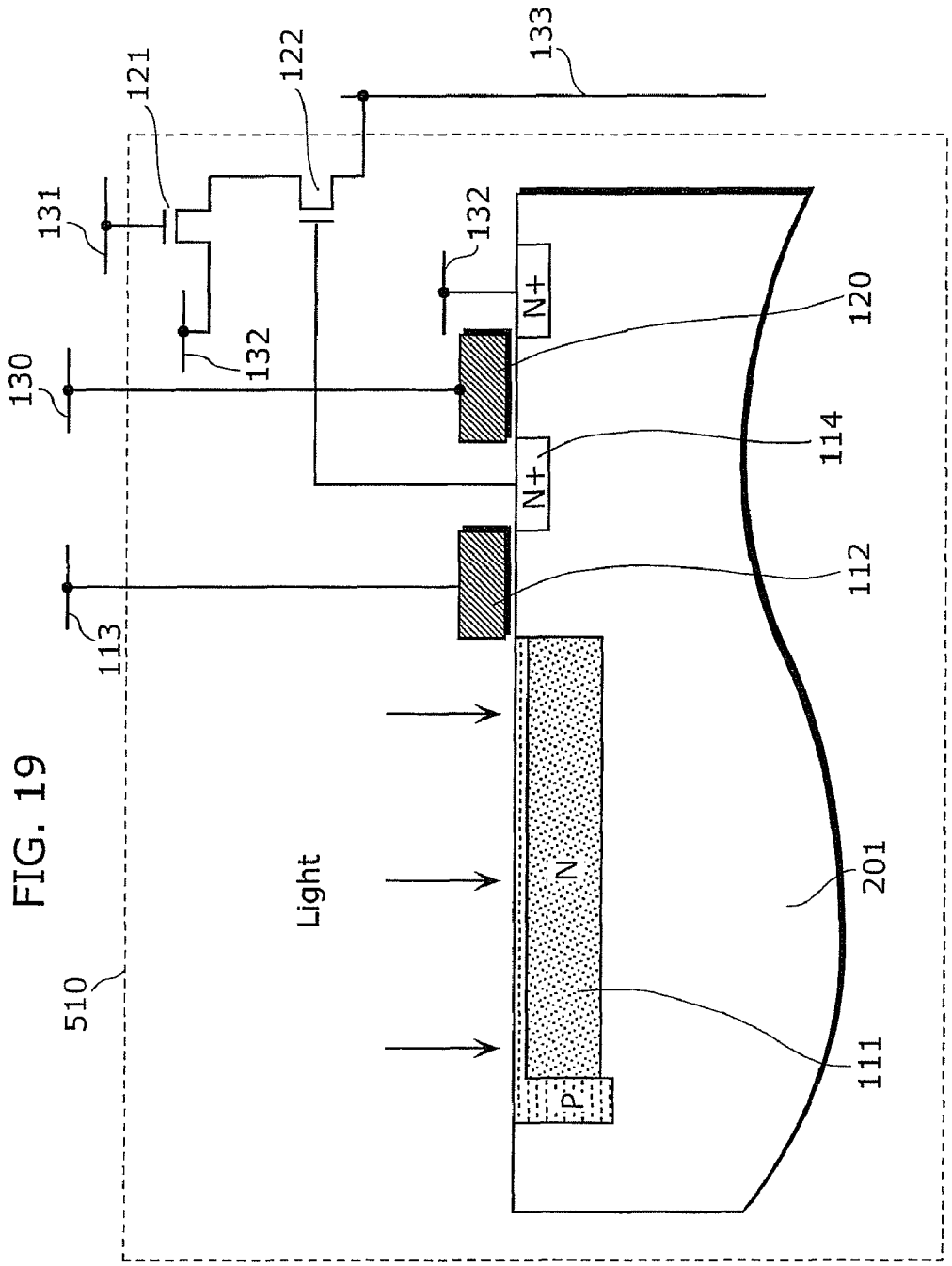
FIG. 19 is a diagram schematically showing a connection relationship between constitutional elements between unit pixels in the conventional solid-state imaging device.

FIG. 15A is a plan view showing a placement of the intra layer lens 206 in the pixel array 431. FIG. 15B is a plan view showing a placement of the top lens 210 in the pixel array 431.

A first placement cell 441 shown in FIGS. 15A and 15B is a unit cell for constituent elements in the lower layer (the photodiode 111 and the charge transfer gate 112, and so on) included in the unit pixel 101. A second placement cell 442 is a unit cell for the constituent elements in the upper layer (the top lens 210, the intralayer lens 206, the wirings 203A to 203C, and so on) included in the unit pixel 101.

That is, in each of the plural unit pixels 101, the constituent elements in the lower layer are placed based on the first placement cell 441, and the constituent elements in the upper layer are placed based on the second placement cell 442.

As shown in FIGS. 15A and 15B, the first placement cell 441 and the second placement cell 442 overlap with each other in the center portion of the pixel array 431, and the center of the second placement cell 442 is displaced further toward the center of the pixel array 431 with respect to the center of the first placement cell 441, as viewed along the direction from the center of the pixel array 431 toward the periphery. That is, the intralayer lens 206 and the top lens 210 are displaced further toward the center of the pixel array 431 at a point closer to the periphery.

FIG. 16 is a cross-sectional view near a section L1-L2 that is a periphery of the pixel array 431 in FIGS. 15A and 15B. Note that the cross-sectional view near a section K1-K2 that is the center portion of the pixel array 431 in FIGS. 15A and 15B is the same as in FIG. 3.

As shown in FIG. 16, displacing the intralayer lens 206 and the top lens 210 toward the center of the pixel array 431 facilitates incidence of the oblique light onto the centroid of the photodiode 111. This allows improving the light collection ratio of the solid-state imaging device 100 according to the second embodiment of the present invention.

Note that as described in the first embodiment, in the solid-state imaging device 100 according to an implementation of the present invention, the centroid 304 of the intralayer lens 206 and the centroid 303 of the top lens 210 are displaced toward the centroid 302 of the photodiode 111. That is, in the plural unit pixels 101, the centroid 302 of the photodiode 111 is displaced in the displacement direction from the center of the first placement cell 411 of a current unit pixel 101, the top lens 210 is formed to have the centroid 303 displaced in the displacement direction from the center of the second placement cell 442 of the current unit pixel 101, and the intralayer lens 206 is formed to have the centroid 304 displaced in the displacement direction from the center of the second placement cell 442 of the current unit pixel 101.

With this, the intralayer lens 206 and the top lens 210 are placed in every other row with large and small amounts of displacement alternately provided toward the center of the pixel array 431.

Note that the above description has described an example of displacing, as viewed along the direction from the center portion toward the periphery of the pixel array 431, the placement position of the top lens 210 further toward the center portion 432 of the pixel array 431, but the centroid 303 of the top lens 210 may be displaced toward the center portion 432 of the pixel array 431 by adjusting the shape of the top lens 210. Furthermore, the shape and placement position of the top lens 210 may be adjusted.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable to a solid-state imaging device, and is particularly applicable to a video camera, a digital still camera, a fax machine, and so on.

What is claimed is:

1. A solid-state imaging device comprising a plurality of pixels arranged in a matrix,
   wherein each of said plurality of pixels includes:
   a photoelectric conversion unit configured to perform photoelectric conversion on light so as to convert the light into an electric signal;
   a first lens which collects incident light; and
   a second lens which collects, to said photoelectric conversion unit, the incident light collected by said first lens,
   an effective center of a light-receiving face of said photoelectric conversion unit is displaced from a pixel center into a first direction,
   said first lens is formed into an asymmetric shape to have a focal position displaced from the pixel center into the first direction, and
   said second lens is formed to have a focal position displaced from the pixel center into the first direction.

2. The solid-state imaging device according to claim 1,
   wherein each of said plurality of pixels further includes
   a gate electrode which covers part of the light-receiving face of said photoelectric conversion unit and through which to transfer the electric signal resulting from the photoelectric conversion performed by said photoelectric conversion unit, and
   the first direction is opposite to a direction in which said gate electrode is placed, with respect to said photoelectric conversion unit.

3. The solid-state imaging device according to claim 1,
   wherein said first lens is: symmetric with respect to a face which is perpendicular to a surface of said photoelectric conversion unit and is laterally located along the first direction, and which includes the pixel center; and asymmetric with respect to a face which is perpendicular to the surface of said photoelectric conversion unit and is also perpendicular to the first direction, and which includes the pixel center.

4. The solid-state imaging device according to claim 1,
   wherein, in each of said plurality of pixels, a region which is located at an end opposite to the first direction and in which said first lens is not formed is wider than a region which is located at an end in the first direction and in which said first lens is not formed.

5. The solid-state imaging device according to claim 1, wherein the first direction is a diagonal direction of each of said plurality of pixels.

6. The solid-state imaging device according to claim 5, wherein, of first lenses included in four adjacent pixels, said first lens contacts first lenses included in two pixels located in the first direction and does not contact first lenses included in two pixels located in a direction opposite to the first direction.

7. The solid-state imaging device according to claim 1, wherein, in each of said plurality of pixels, said second lens has almost a same shape and is placed to have a center displaced from the pixel center into the first direction.

8. The solid-state imaging device according to claim 2, wherein each of said first and second lenses is formed to have the focal position displaced from the pixel center into the first direction at a distance equivalent to half a distance in a gate length direction of said gate electrode included in a region in which said gate electrode covers part of said photoelectric conversion unit.

9. The solid-state imaging device according to claim 1, wherein said first lens is placed to have a center displaced from the pixel center into the first direction.

10. The solid-state imaging device according to claim 1, wherein each of said plurality of pixels includes a first pixel and a second pixel, and
the first direction is different between said first and second pixels.

11. The solid-state imaging device according to claim 10, wherein said plurality of pixels have a multi-pixel one-cell configuration in which one cell includes multiple pixels, and
said one cell includes said first and second pixels.

12. The solid-state imaging device according to claim 1, wherein, in each of said plurality of pixels, said photoelectric conversion unit is placed based on a first placement cell, and said first and second lenses are placed based on a second placement cell,
in a pixel array including said plurality of pixels arranged in a matrix, a center of said second placement cell is displaced, as viewed along a direction from a center of said pixel array toward a periphery, further toward the center of said pixel array with respect to a center of said first placement cell, said first placement cell and said second placement cell being included in each of said plurality of pixels,
the effective center of the light receiving face of said photoelectric conversion unit is displaced from the center of said first placement cell into the first direction,
said first lens is formed to have the focal position displaced from the center of said second placement cell into the first direction, and
said second lens is formed to have the focal position displaced from the center of said second placement cell into the first direction.

13. The solid-state imaging device according to claim 1, wherein said second lens is an upwardly convex lens.

14. The solid-state imaging device according to claim 1, wherein said second lens is a downwardly convex lens.

15. A method of manufacturing a solid-state imaging device including a plurality of pixels arranged in a matrix, wherein each of the plurality of pixels includes:
a photoelectric conversion unit which performs photoelectric conversion on light so as to convert the light into an electric signal;
a first lens which collects incident light; and
a second lens which collects, to the photoelectric conversion unit, the incident light collected by the first lens,
said method comprising:
forming the photoelectric conversion unit of which a light-receiving face has an effective center displaced from a pixel center into a first direction;
forming the second lens having a focal position displaced from the pixel center into the first direction; and
forming the first lens into an asymmetric shape to displace the focal position from the pixel center into the first direction.

16. The method of manufacturing a solid-state imaging device according to claim 15,
wherein said forming of the first lens includes:
patterning a material for the first lens, using a mask which is: symmetric with respect to a center line extended in the first direction including the pixel center; and asymmetric with respect to a center line that is orthogonal to the first direction including the pixel center; and
reflowing the patterned material, so as to form the first lens having an asymmetric shape and a curved convex surface.

17. The method of manufacturing a solid-state imaging device according to claim 16,
wherein in said patterning, the material for the first lens is patterned, using the mask, into a pentagonal shape that is formed by cutting off one of angles of a rectangle, and
the one of the angles of the rectangle is located opposite to the first direction.

* * * * *